(12) United States Patent
Zhang et al.

(10) Patent No.: US 11,171,221 B2
(45) Date of Patent: Nov. 9, 2021

(54) VFET BOTTOM EPITAXY FORMED WITH ANCHORS

(71) Applicant: International Business Machines Corporation, Armonk, NY (US)

(72) Inventors: Chen Zhang, Albany, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/450,712

(22) Filed: Jun. 24, 2019

(65) Prior Publication Data
US 2019/0312129 A1    Oct. 10, 2019

Related U.S. Application Data

(62) Division of application No. 15/865,902, filed on Jan. 9, 2018, now Pat. No. 10,374,060.

(51) Int. Cl.
*H01L 29/66* (2006.01)
*H01L 29/78* (2006.01)
(Continued)

(52) U.S. Cl.
CPC .... *H01L 29/66666* (2013.01); *H01L 21/2252* (2013.01); *H01L 21/3065* (2013.01); *H01L 21/3086* (2013.01); *H01L 29/0653* (2013.01); *H01L 29/0847* (2013.01); *H01L 29/66553* (2013.01); *H01L 29/7827* (2013.01); *H01L 21/2253* (2013.01); *H01L 27/0886* (2013.01);
(Continued)

(58) Field of Classification Search
CPC ........... H01L 29/66666; H01L 29/7827; H01L 29/0847; H01L 29/66553; H01L 29/0653; H01L 21/3065; H01L 21/3086; H01L 21/2252; H01L 29/66795; H01L 29/78642; H01L 21/2253; H01L 29/517; H01L 29/66492; H01L 29/785; H01L 27/0886

See application file for complete search history.

(56) References Cited

U.S. PATENT DOCUMENTS 6,770,534 B2    8/2004  Cho et al.
7,037,994 B2    5/2006  Sugita et al.
(Continued)

OTHER PUBLICATIONS

List of IBM Patents or Applications Treated as Related (2 pages).

*Primary Examiner* — Patricia D Reddington
(74) *Attorney, Agent, or Firm* — Randall Bluestone; Michael J. Chang, LLC

(57) ABSTRACT

Techniques for forming VFET bottom source and drain epitaxy with anchors are provided. In one aspect, a method of forming a VFET device includes: patterning at least one fin in a substrate; forming anchors on opposite ends of the at least one fin; laterally etching a base of the at least one fin, wherein the anchors prevent the lateral etching from being performed on the ends of the at least one fin; forming bottom source and drains at the base of the at least one fin between the anchors; removing the anchors; forming bottom spacers on the bottom source and drains; forming gates above the bottom spacers alongside the at least one fin; forming top spacers above the gates; and forming top source and drains above the top spacers at a top of the at least one fin. VFET devices are also provided.

20 Claims, 19 Drawing Sheets

(51) Int. Cl.
*H01L 29/08* (2006.01)
*H01L 29/06* (2006.01)
*H01L 21/3065* (2006.01)
*H01L 21/308* (2006.01)
*H01L 21/225* (2006.01)
*H01L 29/51* (2006.01)
*H01L 29/786* (2006.01)
*H01L 27/088* (2006.01)

(52) U.S. Cl.
CPC ...... *H01L 29/517* (2013.01); *H01L 29/66492* (2013.01); *H01L 29/66795* (2013.01); *H01L 29/785* (2013.01); *H01L 29/78642* (2013.01)

(56) References Cited

U.S. PATENT DOCUMENTS

| | | |
|---|---|---|
| 7,078,298 B2 | 7/2006 | Lee et al. |
| 7,244,549 B2 | 7/2007 | Iwasawa et al. |
| 7,300,837 B2 | 11/2007 | Chen et al. |
| 7,303,855 B2 | 12/2007 | Hatakeyama et al. |
| 7,358,025 B2 | 4/2008 | Hatakeyama |
| 7,683,428 B2 | 3/2010 | Chidambarrao et al. |
| 9,202,894 B1 | 12/2015 | Zang |
| 9,299,835 B1 | 3/2016 | Anderson et al. |
| 9,614,087 B1 | 4/2017 | Cheng et al. |
| 9,755,073 B1 | 9/2017 | Cheng et al. |
| 9,799,765 B1 | 10/2017 | Bergendahl et al. |
| 9,837,408 B1 | 12/2017 | Bi et al. |
| 2006/0261406 A1 | 11/2006 | Chen |
| 2017/0287911 A1* | 10/2017 | Nowak ............ H01L 21/823885 |
| 2019/0067474 A1* | 2/2019 | Wong ................... H01L 29/1037 |
| 2019/0088767 A1* | 3/2019 | Xie ..................... H01L 29/7827 |
| 2019/0206743 A1* | 7/2019 | Zang ................... H01L 21/2018 |

\* cited by examiner

A-A'

C-C'

A-A'

C-C′

A-A′

C-C'

A-A'

A-A'

A-A'

VFET BOTTOM EPITAXY FORMED WITH ANCHORS

CROSS-REFERENCE TO RELATED APPLICATIONS

This application is a divisional of U.S. application Ser. No. 15/865,902 filed on Jan. 9, 2018, now U.S. Pat. No. 10,374,060, the contents of which are incorporated by reference herein.

FIELD OF THE INVENTION

The present invention relates to vertical field effect transistors (VFETs), and more particularly, to VFET bottom source and drain epitaxy formed with anchors.

BACKGROUND OF THE INVENTION

As opposed to planar complementary metal-oxide-semiconductor (CMOS) devices, vertical field effect transistors (VFETs) are oriented with a vertical fin channel disposed on bottom source and drains and a top source and drain disposed on the vertical fin channel. A gate runs vertically alongside the vertical fin channel.

The process for forming a VFET begins with the patterning of fins in a substrate. Prior to forming the bottom source and drains using epitaxy, it is preferable to laterally trim down the fins below the vertical fin channels. That way, the bottom source and drain epitaxy will be closer to the vertical fin channels which can lead to a sharper junction as less aggressive thermal processing is needed for driving dopants into the extension region.

However, there are challenges in terms of mechanical stability after the lateral trimming. With a lot of trimming at its base, the fin can even fall over.

Therefore, techniques that permit lateral trimming at the base of the fin to be performed without compromising the mechanical stability of the fin would be desirable.

SUMMARY OF THE INVENTION

The present invention provides vertical field-effect transistor (VFET) bottom source and drain epitaxy formed with anchors. In one aspect of the invention, a method of forming a VFET device is provided. The method includes: patterning at least one fin in a substrate; forming anchors on opposite ends of the at least one fin; laterally etching a base of the at least one fin, wherein the anchors prevent the lateral etching from being performed on the ends of the at least one fin; forming bottom source and drains at the base of the at least one fin between the anchors; removing the anchors; forming bottom spacers on the bottom source and drains; forming gates above the bottom spacers alongside the at least one fin; forming top spacers above the gates; and forming top source and drains above the top spacers at a top of the at least one fin.

In another aspect of the invention, a VFET device is provided. The VFET device includes: at least one fin patterned in a substrate, wherein a top of the at least one fin has a width w, and a base of the at least one fin has a width w', and wherein w'<w; bottom source and drains at the base of the at least one fin; bottom spacers on the bottom source and drains; gates above the bottom spacers alongside the at least one fin; top spacers above the gates; and top source and drains above the top spacers at the top of the at least one fin.

In yet another aspect of the invention, another VFET device is provided. The VFET device includes: at least one fin patterned in a substrate, wherein the at least one fin is fully cut from the substrate; bottom source and drains below the at least one fin, wherein the at least one fin rests fully on the bottom source and drains; bottom spacers on the bottom source and drains; gates above the bottom spacers alongside the at least one fin; top spacers above the gates; and top source and drains above the top spacers at the top of the at least one fin.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming vertical field effect transistor (VFET) devices that use an anchor to hold the fin during lateral etching at the base of the fin for bottom source and drain epitaxy such that the structure will not fall over even if an aggressive trimming is used. In fact, embodiments are contemplated herein where a complete removal of the base of the fin is performed enabling the bottom source and drain epitaxy to full span the bottom of the vertical fin channel.

Figure 1:
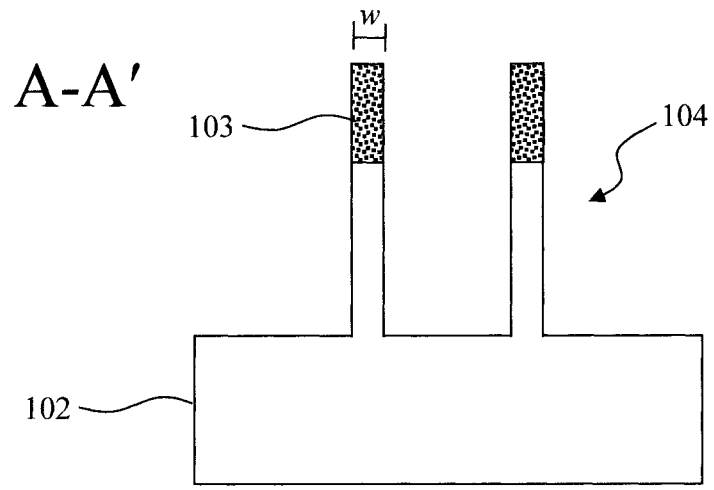
FIG. 1 is a fin width cross-section illustrating fins having been patterned in a substrate according to an embodiment of the present invention.
Figure 2:
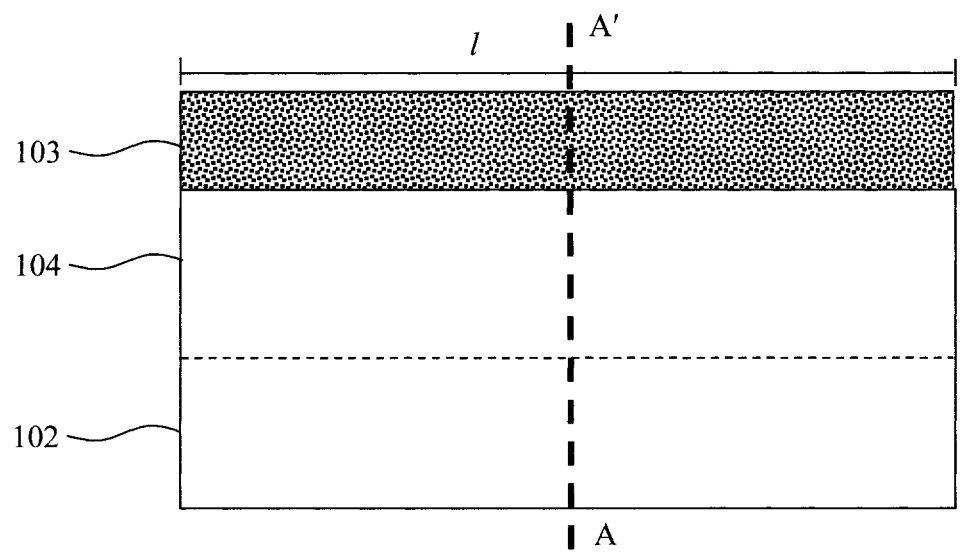
FIG. 2 is a fin length cross-section illustrating the fins having been patterned in the substrate according to an embodiment of the present invention.

An exemplary embodiment for forming a VFET device in accordance with the present techniques is now described by way of reference to FIGS. 1-48. As shown in FIG. 1, the process begins with a substrate 102 into which at least one fin 104 is patterned.

According to an exemplary embodiment, the substrate 102 is undoped. A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

To pattern fins 104, fin hardmasks 103 are formed on the substrate marking the footprint and location of the fins 104. The fin hardmasks 103 are then used to pattern the fins 104 in the substrate 102. A directional etching process such as reactive ion etching (RIE) can be employed for the fin etch. As shown in FIG. 1, as patterned, the fins 104 extend partway through the substrate 102. What is shown in FIG. 1 is a fin width (w) cross-section, i.e., perpendicular to a length of the fins 104. In order to illustrate the present fin anchor design, reference will be made to several different cross-sectional views throughout the process. For instance, a fin length (l) cross-section, i.e., of one of the fins 104 parallel to the length l of the fin, is provided in FIG. 2. Namely, the cross-sectional view in FIG. 1 depicts a cut along the line A-A' in FIG. 2.

Since the fins 104 are patterned in the substrate 102, these structures would appear similar in a fin length cross-section. Thus, a dotted line is used in FIG. 2 (and the other fin length cross-sections provided herein) to distinguish the substrate 102 from the fins 104. Namely, the structure beneath the dotted line is the substrate and the structure above the dotted line is the fin.

Figure 3:
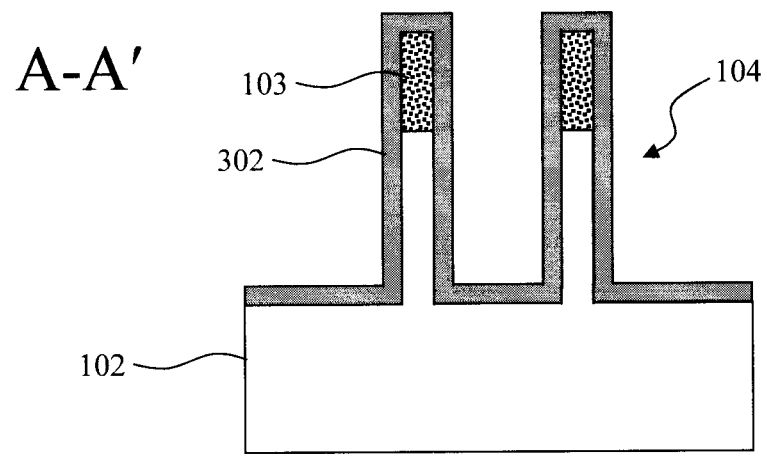
FIG. 3 is a fin width cross-section illustrating a protection layer having been formed over the fins according to an embodiment of the present invention.
Figure 4:
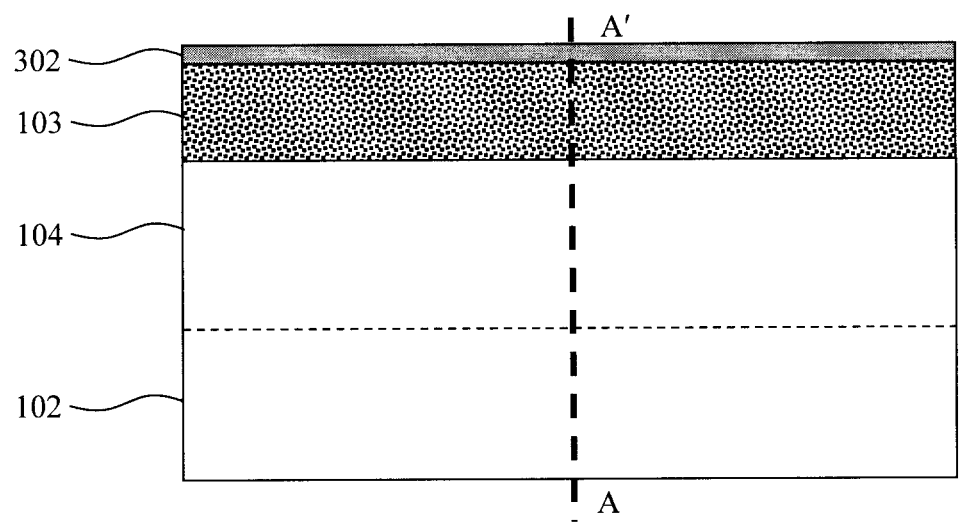
FIG. 4 is a fin length cross-section illustrating the protection layer having been formed over the fins according to an embodiment of the present invention.

A protection layer 302 is then formed over the fins 104. See FIGS. 3-4. Layer 302 serves to protect the fins 104 during a subsequent fin etch to create space at the base of the fins 104 for the bottom source and drain epitaxy. As shown in FIG. 3 (a fin width cross-section), the protection layer 302 is a conformal layer that is deposited onto the fins 104 and fin hardmasks 103, along the sidewalls of the fins 104, and on top of an exposed surface of the substrate 102 in between the fins 104. As shown in FIG. 4 (a fin length cross-section), the protection layer is present on the fin hardmasks 103. The cross-sectional view in FIG. 3 depicts a cut along the line A-A' in FIG. 4.

Suitable materials for the protection layer 302 include, but are not limited to, dielectric materials such as silicon dioxide ($SiO_2$), silicon nitride (SiN) and/or silicon oxynitride (SiON). According to an exemplary embodiment, the protection layer 302 is deposited using a conformal deposition process such as chemical vapor deposition (CVD) or atomic layer deposition (ALD) to a thickness of from about 2 nanometers (nm) to about 10 nm, and ranges therebetween.

Anchors 502 are then formed at the ends of the fins 104. See FIGS. 5-7. As provided above, placement of the anchors 502 enables a lateral thinning at the base of the fins 104 (and in some cases even completely cutting the fin bottom) without worrying about having the fin collapse from lack of mechanical support.

The fins 104 will serve as the basis for forming vertical fin channels of the VFETs. As will be described in detail below, the anchors will be placed at the ends of the fins 104 outside of the vertical fin channels. Following the lateral thinning at the base of the fins 104 and the bottom source drain epitaxy, the anchors are removed and the (anchored) ends of the fins 104 are cut. Thus, the anchors provide mechanical support for the fins 104 during an important stage in the bottom source and drain processing.

Figure 5:
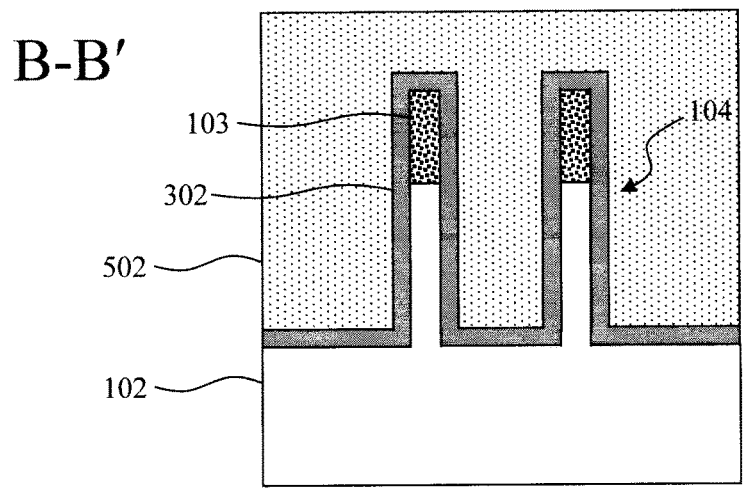
FIG. 5 is a fin width cross-section at ends of the fins illustrating anchors having been formed at the ends of the fins according to an embodiment of the present invention.
Figure 6:
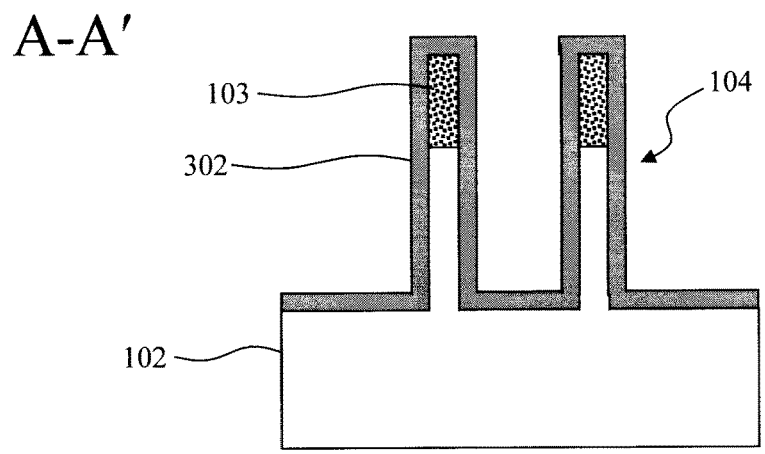
FIG. 6 is a fin width cross-section at a middle of the fins illustrating that the anchors are absent at the middle of the fins according to an embodiment of the present invention.
Figure 7:
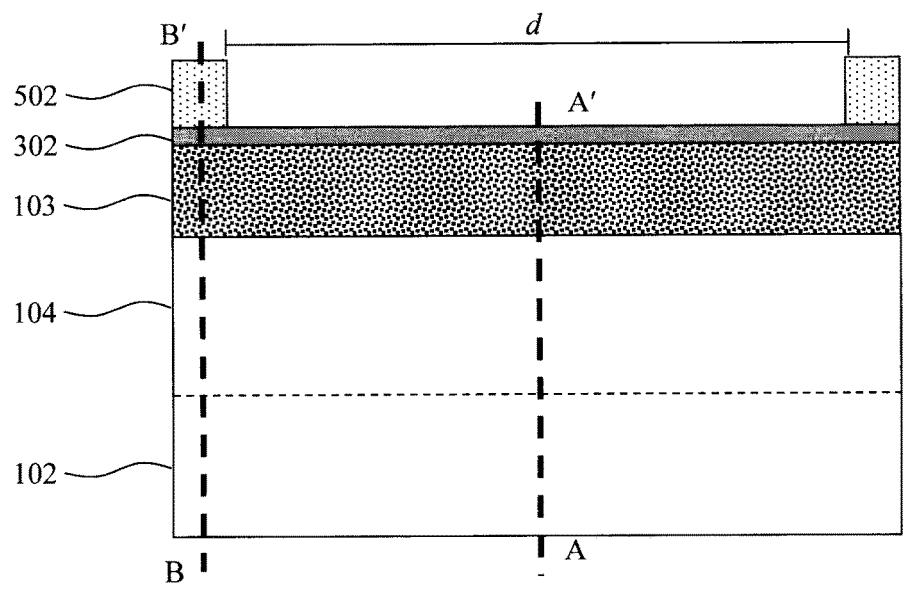
FIG. 7 is a fin length cross-section illustrating the anchors having been formed at the ends of the fins according to an embodiment of the present invention.

Specifically, as shown in FIG. 5 (a fin width cross-section at the ends of the fins 104), the anchor 502 is formed over the protection layer 302 at the ends of the fins 204. Compare, for example, FIG. 6 (a fin width cross-section at the middle of the fins 104) which illustrates how the anchors 502 are absent over the (middle) portions of the fins 104 that will form the vertical fin channels of the VFETs. The reason for this configuration is straightforward. Namely, the anchors 502 provide support at the ends of the fins 104 while permitting the fins 104 to be laterally trimmed below the vertical fins channels prior to the source and drain epitaxy. As shown in FIG. 7 (a fin length cross-section), the anchors 502 are present on opposite ends of the fins 104. Notably, the anchors 502 are set apart from one another by a distance d which is greater than a final fin length ($l_{fin}$) (see, e.g., FIGS. 35 and 38, described below), i.e., $d > l_{fin}$. The cross-sectional view in FIG. 5 depicts a cut along the line B-B' in FIG. 7. The cross-sectional view in FIG. 6 depicts a cut along the line A-A' in FIG. 7.

Figure 8:
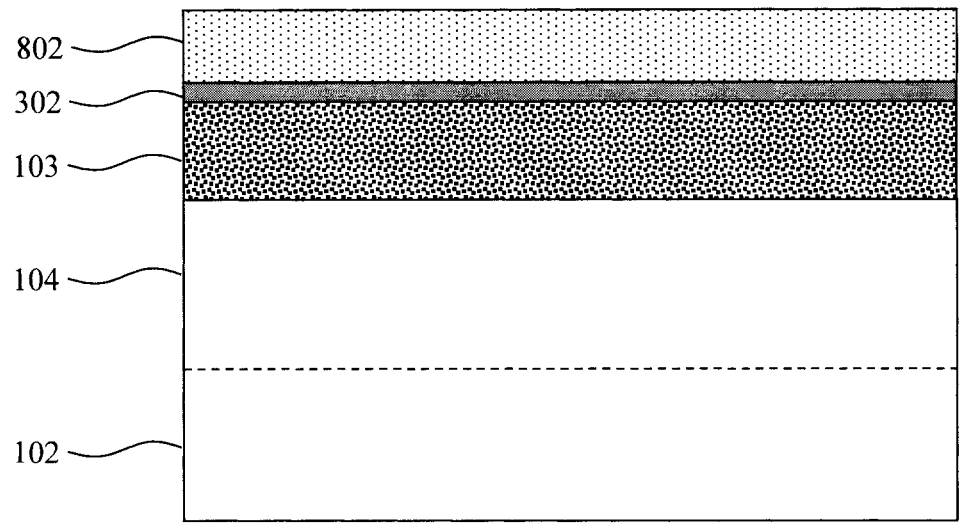
FIG. 8 is a fin length cross-section illustrating a layer of the anchor material having been deposited onto the protection layer according to an embodiment of the present invention.
Figure 9:
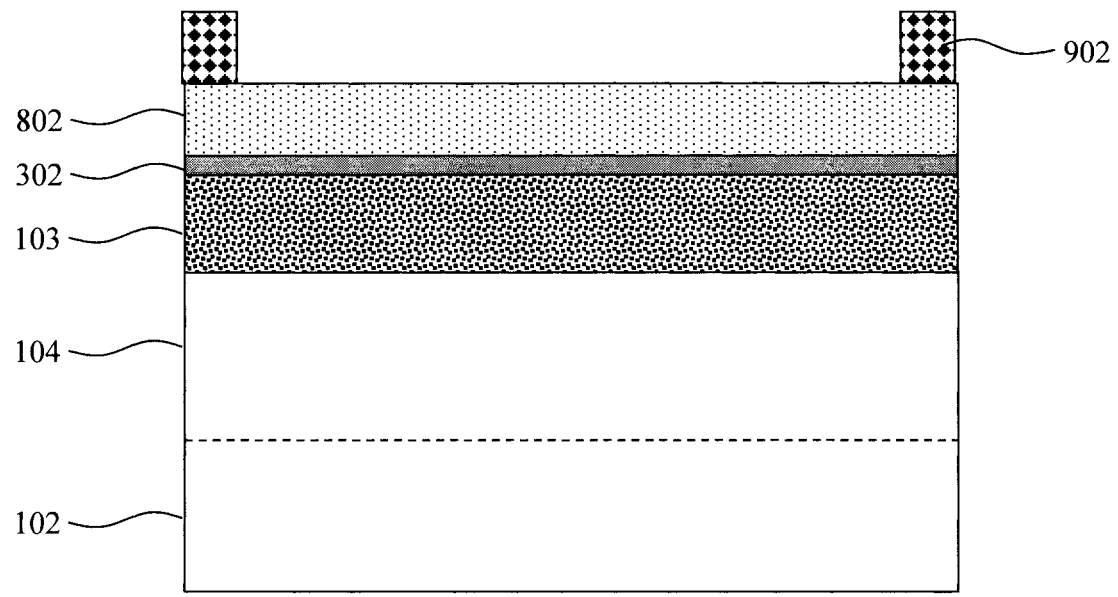
FIG. 9 is a fin length cross-section illustrating a patterned hardmask having been formed over the layer of the anchor material, marking the footprint and location of the anchors according to an embodiment of the present invention.

According to an exemplary embodiment, the anchors 502 are formed from a dielectric material such as $SiO_2$ and/or silicon oxycarbide (SiCO). In one embodiment, the anchors 502 are formed using a direct patterning process. See, for example, FIGS. 8 and 9 (both depicting fin length cross-sections). As shown in FIG. 8, a layer 802 of the anchor material (e.g., SiO$_2$ and/or SiCO) is deposited onto the protection layer 302. Next, as shown in FIG. 9, standard lithography techniques are used to form a patterned hardmask 902 over the layer 802 of the anchor material, marking the footprint and location of the anchors 502. Notably, the patterned hardmask 902 sets the distance d the anchors 502 are spaced apart from one another. See FIG. 7—described above. A selective etch process using the patterned hardmask can then be used to is then used pattern the layer 802 of the anchor material into the individual anchors 502.

As shown in FIG. 9, the anchors 502 are then formed on opposite sides of the mandrel 802. The mandrel 802 is a sacrificial structure used merely to the place the anchors 502. When the mandrel 802 is removed, the anchors 502 will remain at the ends of the fins as shown in FIG. 7.

Figure 10:
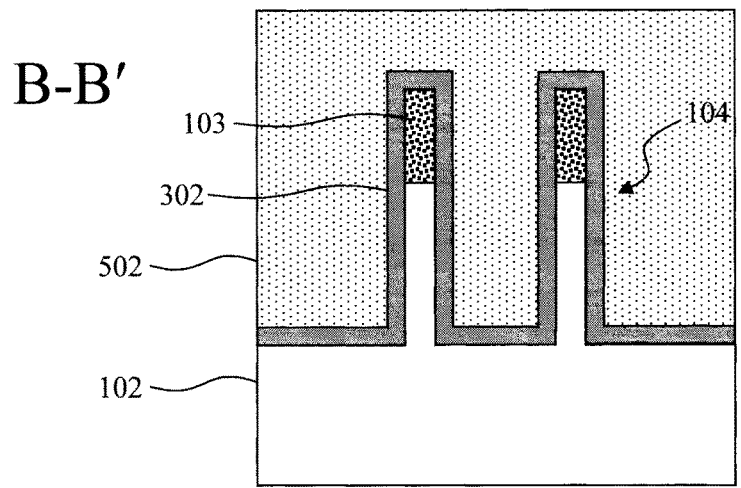
FIG. 10 is a fin width cross-section at ends of the fins illustrating the anchors covering the protection layer at the ends of the fins during a recess etch according to an embodiment of the present invention.

An etch is then used to recess the substrate 102 at the base of the fins 104 (between the anchors 502) to create space for the bottom source and drain epitaxy. See FIGS. 10-12. This recess etch occurs only at the vertical fin channel portions of the fins 104. Specifically, as shown in FIG. 10 (a fin width cross-section at the ends of the fins 104), the anchor 502 prevents the recess at the ends of the fins 104. However, the anchors 502 are absent over the (middle) portion of the fins 104 that will form the vertical fin channels of the VFETs. Thus, as shown in FIG. 11 (a fin width cross-section at the middle of the fins 104), the recess etch is performed below the vertical fin channels.

Figure 11:
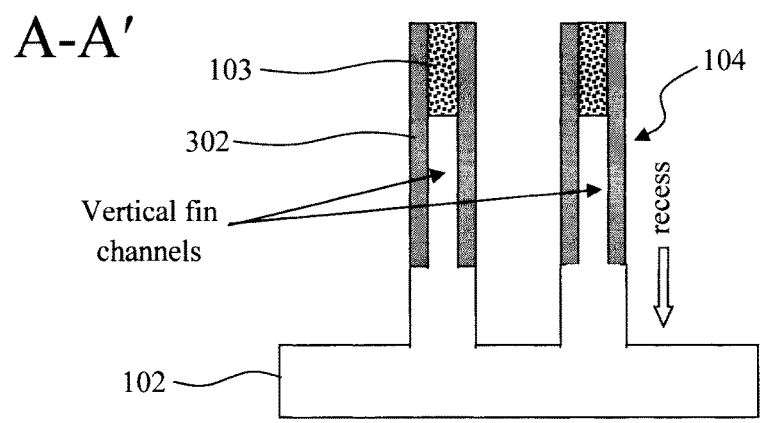
FIG. 11 is a fin width cross-section at a middle of the fins illustrating the protection layer having been patterned to protect sidewalls of the fins and a recess etch of the substrate having been performed between the anchors according to an embodiment of the present invention.

To perform the recess etch, a directional etching process such as RIE is used (between the anchors 502) to first remove the protection layer 302 (exposed over the vertical fin channels) from horizontal surfaces including the fin hardmasks 103 and the top surface of the substrate 102 between the fins 104 (compare, e.g., FIGS. 6 and 11). Following the directional etch, what is left is a portion of the protection layer 302 covering the vertical fin channels as shown in FIG. 11.

A recess etch is then performed (between the anchors 502) to extend the base of the fins 104 into the substrate 102. According to an exemplary embodiment, the recess etch is performed using a directional etching process such as RIE. As shown in FIG. 11, the protection layer 302 covers the sidewalls of the vertical fin channels during the recess etch. As provided above, the anchors 502 prevent any recessing at the ends of the fins 104. Thus, the anchors 502, the protection layer 302, and the fins 104 themselves remain intact in these (end-fin) regions and will serve to support the fins 104 during the lateral etch in the (middle-fin) vertical fin channel regions of the fins 104 (see below).

Figure 12:
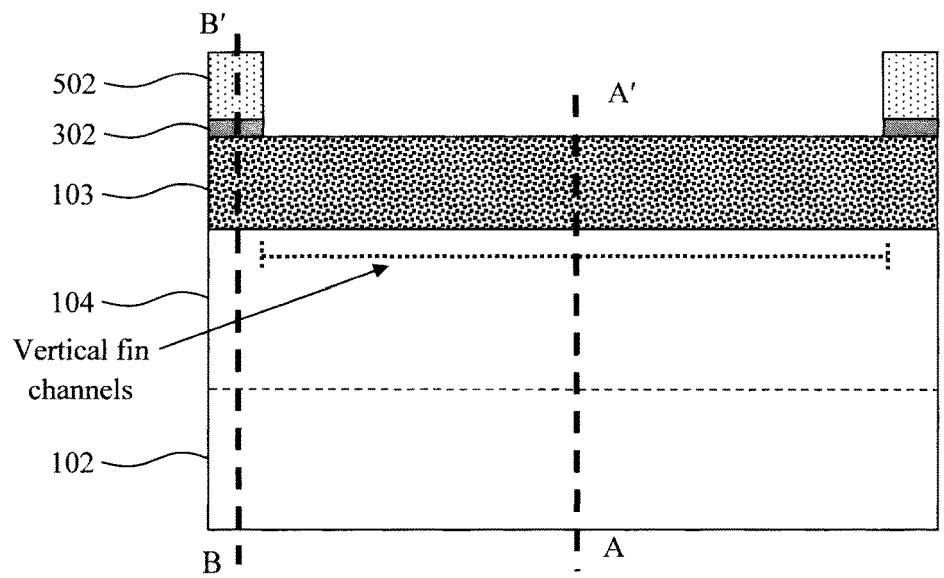
FIG. 12 is a fin length cross-section illustrating the protection layer having been removed from the tops of the fins according to an embodiment of the present invention.

As shown in FIG. 12 (a fin length cross-section), anchors 502 limit removal of the protection layer 302 to the vertical fin channel region of the fins 104. Specifically, as shown in FIG. 12 the protection layer 302 has been removed from on top of the fin hardmasks 302 in the middle region (i.e., the vertical fin channel region) of the fins 104. As described above, the goal is to remove the protection layer 302 from only the horizontal surfaces using a directional etch. Thus, while not visible in the fin length cross-section, portions of the protection layer 302 remain covering the sidewalls of the fins as shown in FIG. 11.

It is notable that the fin length cross-section shown in FIG. 12 is through one of the fins 104. The recess etch is performed in between the fins 104 (see, e.g., FIG. 11). Thus, the recess etch is not visible in the fin length cross-section shown in FIG. 12. The cross-sectional view in FIG. 10 depicts a cut along the line B-B' in FIG. 12. The cross-sectional view in FIG. 11 depicts a cut along the line A-A' in FIG. 12.

A lateral trim at the bottom/base of the fins 104 is next performed. See FIGS. 13-16. As provided above, laterally trimming the fins 104 will result in the bottom source and drain epitaxy being closer to the vertical fin channels which can lead to a sharper junction after dopant diffusion annealing, and thus a better on resistance ($R_{on}$)-drain-induced barrier lowering (DIBL) tradeoff. Advantageously, with the anchors 502 in place and the ends of fins 104 themselves intact, this lateral trim can be performed between the anchors 502 in the middle region (i.e., vertical fin channel region) of the fins 104 without worrying about the fins 104 collapsing, even if the fin bottoms are fully cut from the substrate 102 in that region.

Figure 13:
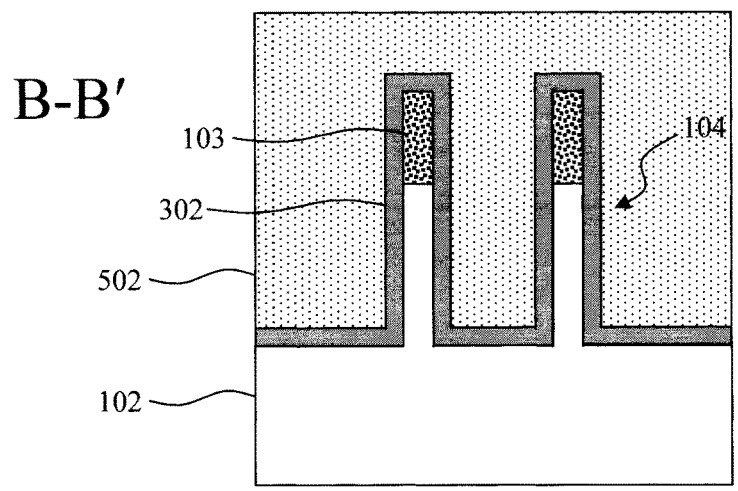
FIG. 13 is a fin width cross-section at ends of the fins illustrating the anchors covering the protection layer at the ends of the fins during a lateral etch according to an embodiment of the present invention.
Figure 14:
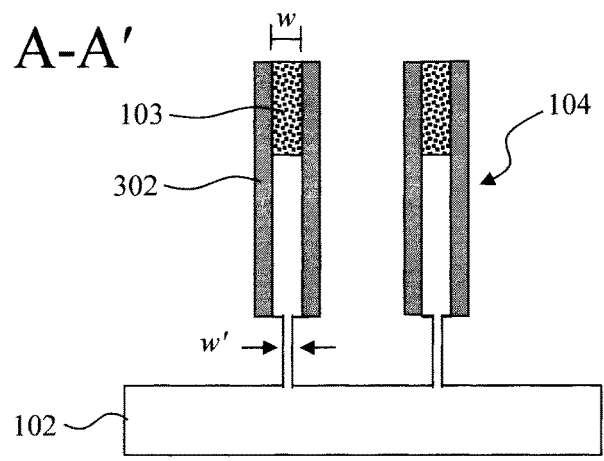
FIG. 14 is a fin width cross-section at a middle of the fins illustrating a lateral etch at a base of the fins having been performed between the anchors according to an embodiment of the present invention.

Specifically, as shown in FIG. 13 (a fin width cross-section at the ends of the fins 104) the anchors 502, the protection layer 302, and the fins 104 themselves remain intact in (end-fin) regions of the fins 104. However, as shown in FIG. 14 (a fin width cross-section at the middle of the fins 104) the base of the fins 104 have been laterally etched. As a result, the bases of the fins 104 have a reduced width (w) as compared to the width (w) at the tops of the fins, i.e., w'<w. According to an exemplary embodiment, w is from about 5 nm to about 10 nm, and ranges therebetween, and w' is from about 0 nm to about 8 nm, and ranges therebetween.

By way of example only, the lateral etch is performed using a non-directional (isotropic) etching process such as a wet etching process. The etch is endpointed when the desired amount of trimming at the base of the fins 104 has been achieved (i.e., when the width w' has been achieved). The protection layer 302 remaining alongside the fins 104 protects the vertical fin channels during this thinning process. Advantageously, following the lateral etching process the fins 104 cannot collapse or fall over (even with the thin bottom width w'—see exemplary values above) since the anchors are in place at the ends of each of the fins 104 to support the middle regions (i.e., the vertical fin channel regions) of the fins 104.

Figure 15:
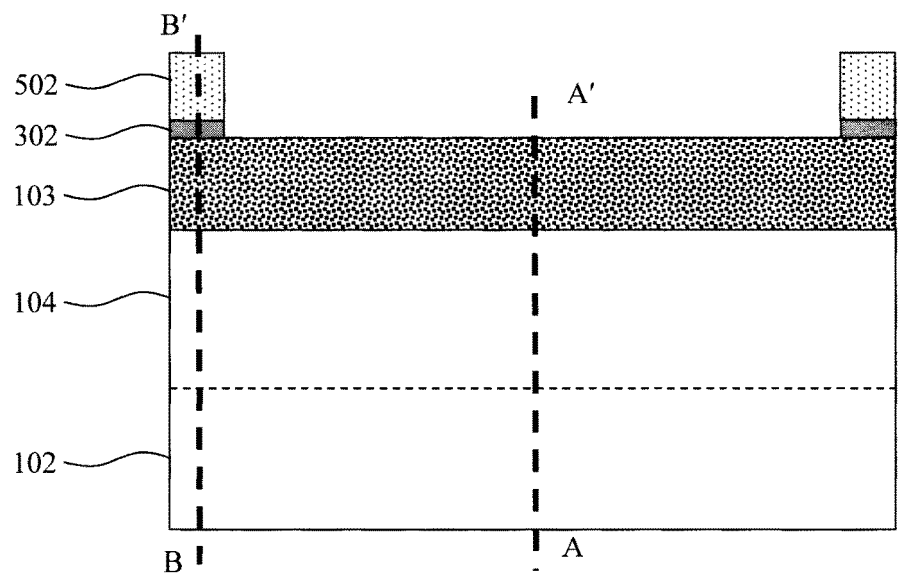
FIG. 15 is a fin length cross-section illustrating the fins after the lateral etch according to an embodiment of the present invention.

The fin length cross-section shown in FIG. 15 is through the (thinned) base of one of the fins 104. Thus, this fin length cross-section would appear the same as that prior to the lateral etch (see, e.g., FIG. 12). The cross-sectional view in FIG. 13 depicts a cut along the line B-B' in FIG. 15. The cross-sectional view in FIG. 14 depicts a cut along the line A-A' in FIG. 15.

According to another exemplary embodiment, a more aggressive lateral etch is employed to fully cut the fin bottom from the substrate 102 at the base of the fins 104. See the alternative embodiment shown in FIG. 16 (a fin width cross-section at the middle of the fins 104) where the bottom of the fin beneath the protection layer 302 has been completely cut. Completely cutting the bottom of the fins 104 can be advantageous, as it eliminates any portion of the fins 104 below the vertical fin channels. Thus, the bottom source and drain dopants have less fin material to diffuse through when forming the bottom junction (see below).

In the same manner as described above, the lateral etch can be performed using a non-directional (isotropic) etching process such as a wet etching process. Here, however, the etch is timed such that the base of the fins 104 is fully removed. The protection layer 302 remaining alongside the fins 104 protects the vertical fin channels during this thinning process.

Figure 16:
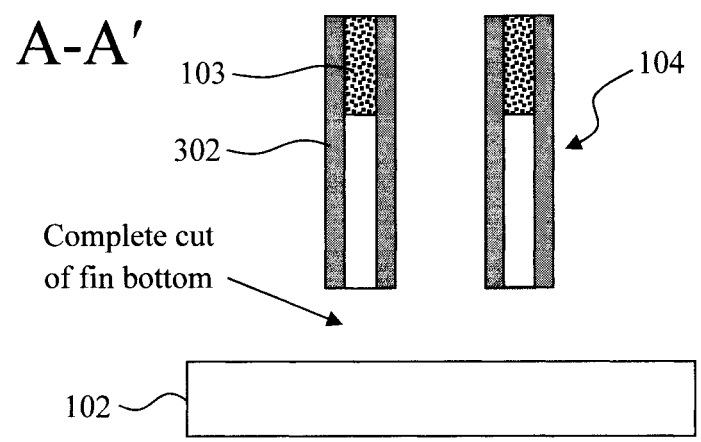
FIG. 16 is a fin width cross-section at a middle of the fins, according to an alternative embodiment, illustrating the fins having been completely cut from the substrate, fully suspending the fins between the anchors according to an embodiment of the present invention.
Figure 17:
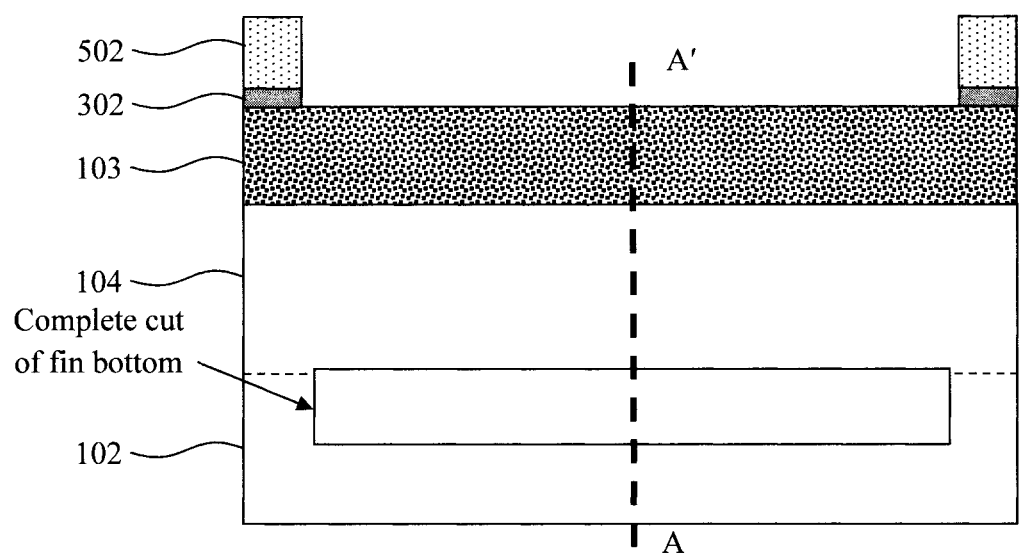
FIG. 17 is a fin length cross-section, according to the alternative embodiment, illustrating the fins having been completely cut from the substrate, fully suspending the fins between the anchors according to an embodiment of the present invention.

As shown in FIG. 17 (a fin length cross-section through one of the fins 104), the bottoms of the fins have been fully cut from the underlying substrate 102 such that the middle portion (i.e., the vertical fin channels) are fully suspended over the substrate 102 between the anchors 502. This configuration is possible because the anchors have kept the ends of fins 104 intact throughout the process. As such, the ends of the fins 104 now serve to support the (suspended) middle portions of the fins 104. The cross-sectional view in FIG. 16 depicts a cut along the line A-A' in FIG. 17.

Figure 18:
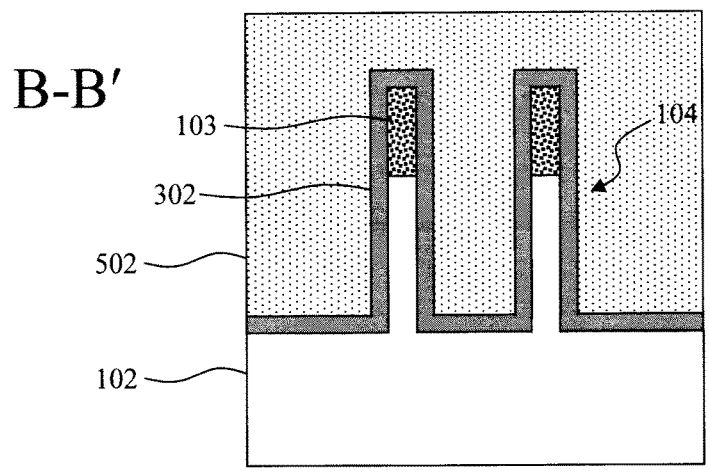
FIG. 18 is a fin width cross-section at ends of the fins illustrating the anchors covering the protection layer at the ends of the fins during bottom source and drain epitaxy according to an embodiment of the present invention.
Figure 19:
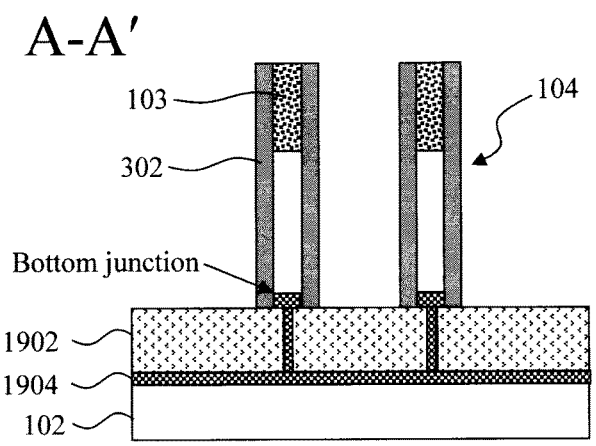
FIG. 19 is a fin width cross-section at a middle of the fins illustrating bottom source and drains having been formed at the base of the fins followed by a drive-in anneal to form bottom junctions according to an embodiment of the present invention.

Bottom source and drain is then formed at the base of the fins 104 between the anchors 502, followed by a drive-in anneal to form bottom junctions. See, for example, FIGS. 18-22. Specifically, as shown in FIG. 18 (a fin width cross-section at the ends of the fins 104) the anchors 502, the protection layer 302, and the fins 104 themselves remain intact in (end-fin) regions of the fins 104. As shown in FIG. 19 (a fin width cross-section at the middle of the fins 104) a bottom source and drains 1902 have been formed at the base of the fins 104. According to an exemplary embodiment, the bottom source and drains 1902 are formed from an n-type or p-type doped epitaxial material grown at the base of the fins 104. Suitable epitaxial materials include, but are not limited to in-situ doped (i.e., during growth) or ex-situ doped (e.g., using a process such as ion implantation) epitaxial Si, epitaxial Ge, and/or epitaxial SiGe. Suitable n-type dopants include phosphorus (P) and/or arsenic (As), and suitable p-type dopants include, but are not limited to, boron (B).

A drive-in anneal is then performed to drive dopants from the bottom source and drains 1902 into the base of the fins 104, forming bottom source and drain extensions 1904 which establish a bottom junction (i.e., a junction between the bottom source and drain 1902 and the vertical fin channels). According to an exemplary embodiment, the drive-in anneal is performed using a spike rapid thermal annealing (RTA) process at a temperature of from about 900° C. to about 1050° C., and ranges therebetween.

Figure 20:
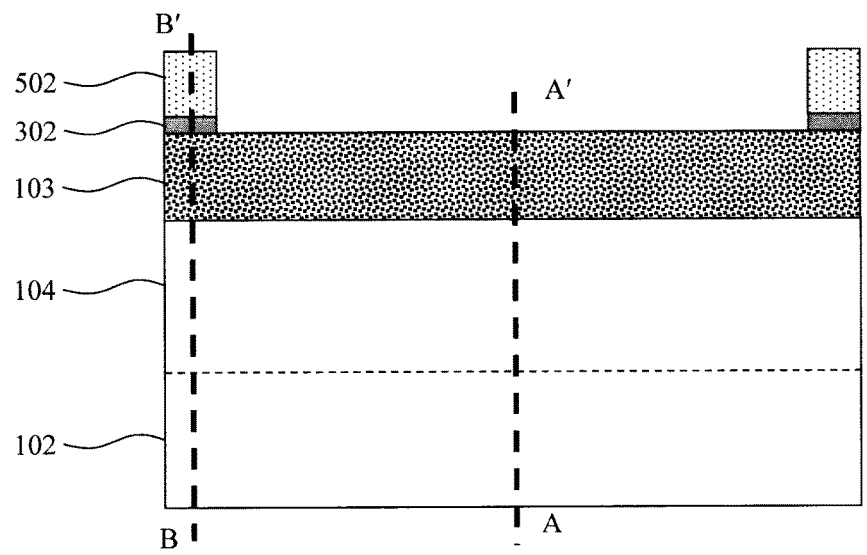
FIG. 20 is a fin length cross-section illustrating the fins after the bottom source and drain epitaxy according to an embodiment of the present invention.

The fin length cross-section shown in FIG. 20 is through the base of one of the fins 104. Thus, this fin length cross-section would appear the same as that prior to formation of the bottom source and drains 1902 (see, e.g., FIG. 15). The cross-sectional view in FIG. 18 depicts a cut along the line B-B' in FIG. 20. The cross-sectional view in FIG. 19 depicts a cut along the line A-A' in FIG. 20.

In the alternative embodiment where the fin bottoms are completely cut from the underlying substrate 102, bottom source and drains 2102 are formed on the substrate 102 beneath the fully-suspended fins 104. See FIG. 21 (a fin width cross-section at the middle of the fins 104). As such, the middle portions of the fins 104 are now fully resting on the bottom source and drains 2102. In the same manner as provided above, the bottom source and drains 2102 can be formed from an n-type or p-type in-situ or ex-situ doped epitaxial material (e.g., epitaxial Si, Ge and/or SiGe) grown at the base of the fins 104. As provided above, suitable n-type dopants include phosphorus (P) and/or arsenic (As), and suitable p-type dopants include, but are not limited to, boron (B).

A drive-in anneal is then performed to drive dopants from the bottom source and drains 2102 into the base of the fins 104, forming bottom source and drain extensions 2104 which establish a bottom junction (i.e., a junction between the bottom source and drain 2102 and the vertical fin channels). Suitable conditions for this drive-in anneal were provided above.

Figure 21:
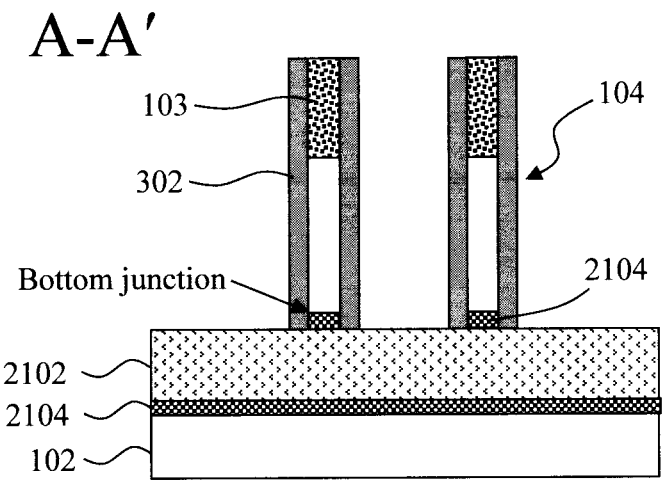
FIG. 21 is a fin width cross-section at a middle of the fins, according to the alternative embodiment where the fins are fully cut, illustrating the bottom source and drains having been formed at the base of the fins followed by a drive-in anneal to form the bottom junctions according to an embodiment of the present invention.
Figure 22:
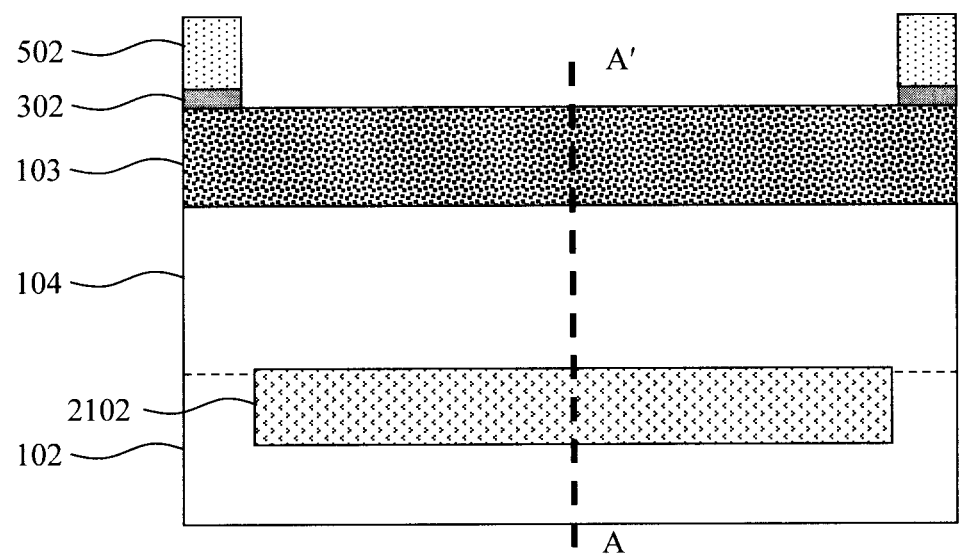
FIG. 22 is a fin length cross-section, according to the alternative embodiment where the fins are fully cut, illustrating the fins after the bottom source and drain epitaxy according to an embodiment of the present invention; according to an embodiment of the present invention.

As shown in FIG. 22 (a fin length cross-section through one of the fins) the middle portions of the fins 104 are now fully resting on the bottom source and drains 2102. The cross-sectional view in FIG. 21 depicts a cut along the line A-A' in FIG. 22.

Figure 23:
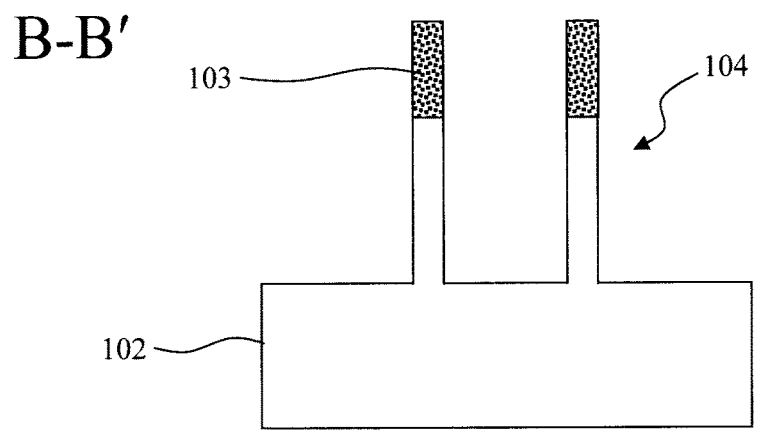
FIG. 23 is a fin width cross-section at ends of the fins illustrating the anchors and protection layer having been removed according to an embodiment of the present invention.

Following formation of the bottom source and drains, the anchors 502 and protection layer 302 can be removed. See FIGS. 23-27. Specifically, as shown in FIG. 23 (a fin width cross-section at the ends of the fins 104) the anchors 502 and the protection layer 302 have been removed from the ends of the fins 104 using, e.g., a selective wet etch. It is notable that, as shown in FIG. 23, the ends of the fins 104 are intact. What is also notable is that the bottom source and drain 1902 is absent at the ends of the fins 104. This configuration is due to the unique nature of the present process whereby the anchors 502 have protected the ends of the fins 104 up to this point in the process flow. Thus, the bottom source and drain epitaxy would not have been formed at the ends of the fins 104.

Figure 24:
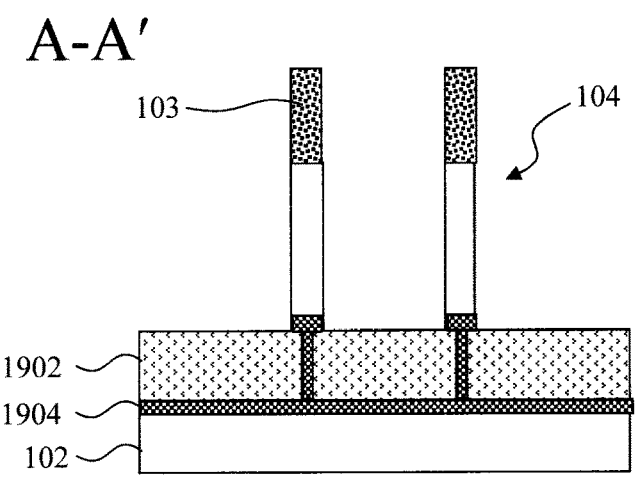
FIG. 24 is a fin width cross-section at a middle of the fins illustrating the protection layer having been removed according to an embodiment of the present invention.

As shown in FIG. 24 (a fin width cross-section at the middle of the fins 104) the protection layer 302 has been removed from alongside the vertical fin channels. Access can then be made to the vertical fin channels for gate formation, etc. See below.

Figure 25:
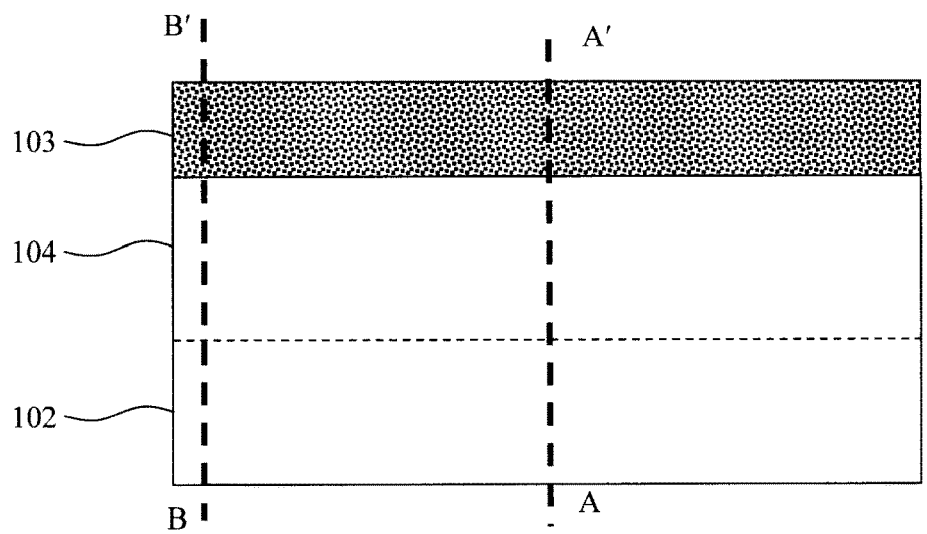
FIG. 25 is a fin length cross-section illustrating the anchors and protection layer having been removed according to an embodiment of the present invention.

As shown in FIG. 25 (a fin length cross-section through one of the fins) the anchors 502 and the protection layer 302 have been removed from the ends of the fins 104. The cross-sectional view in FIG. 23 depicts a cut along the line B-B' in FIG. 25. The cross-sectional view in FIG. 24 depicts a cut along the line A-A' in FIG. 25.

Figure 26:
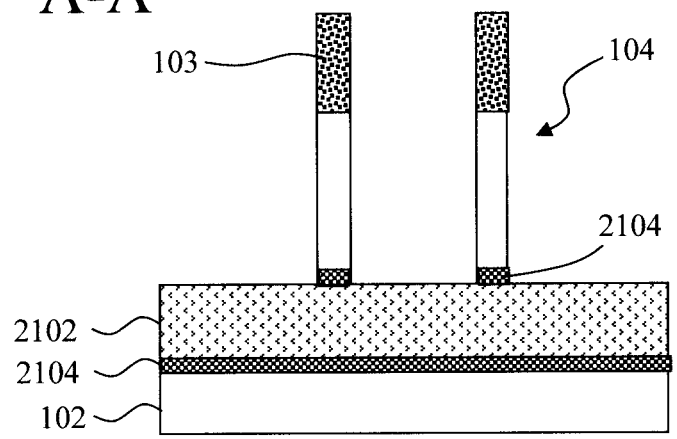
FIG. 26 is a fin width cross-section at a middle of the fins, according to the alternative embodiment where the fins are fully cut, illustrating the protection layer having been removed according to an embodiment of the present invention.
Figure 27:
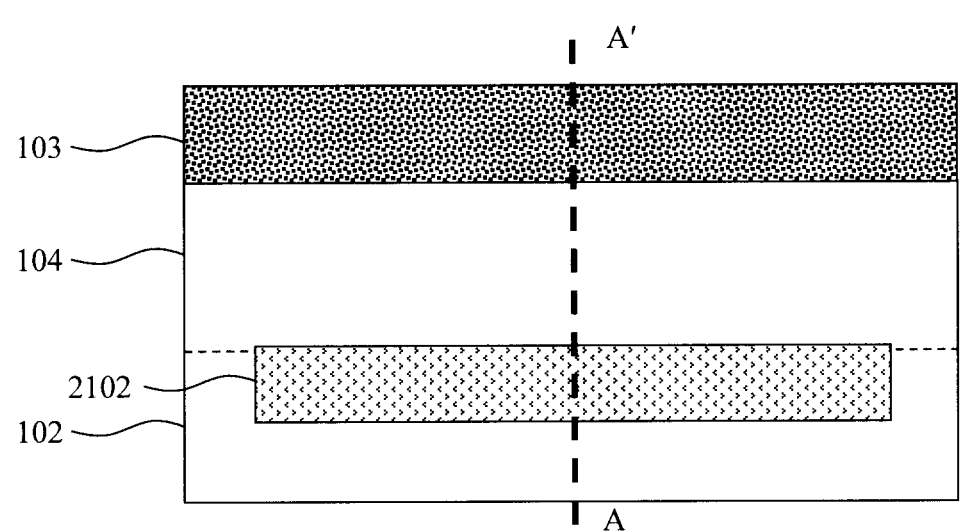
FIG. 27 is a fin length cross-section, according to the alternative embodiment where the fins are fully cut, illustrating the protection layer having been removed according to an embodiment of the present invention; according to an embodiment of the present invention.

In the alternative embodiment where the fin bottoms are completely cut from the underlying substrate 102, as shown in FIG. 26 (a fin width cross-section at the middle of the fins 104) the protection layer 302 has been removed from alongside the vertical fin channels. As shown in FIG. 27 (a fin length cross-section through one of the fins) the anchors 502 and the protection layer 302 have been removed from the ends of the fins 104. The cross-sectional view in FIG. 26 depicts a cut along the line A-A' in FIG. 27.

A bottom protection layer 2802/3102 is then formed over the bottom source and drains. See FIGS. 28-32. The bottom protection layer 2802/3102 will serve to protect the bottom source and drains 1902/2102 and the substrate 102 during a subsequent fin etch to define the final fin channel length ($l_{fin}$) (see below).

According to an exemplary embodiment, the bottom protection layer 2802/3102 is formed using a directional deposition process whereby the material for the bottom protection layer 2802/3102 is deposited onto the bottom source and drains 1902/2102 and the substrate 102 with a greater amount of the material being deposited on these horizontal surfaces as compared to exposed vertical surfaces (such as along sidewalls of the fins 104). Thus, when an etch is used on the protection layer material, the timing of the etch needed to remove this material from the vertical surfaces will leave the bottom protection layer 2802/3102 shown in FIGS. 28-32 on the bottom source and drains 1902/2102 and the substrate 102 since a greater amount of the material was deposited on these horizontal surfaces to begin with. By way of example only, a high density plasma (HDP) chemical vapor deposition (CVD) or physical vapor deposition (PVD) process can be used for directional film deposition, and an isotropic etch can be used to remove the protection layer material deposited onto the vertical surfaces. Suitable materials for the bottom protection layer 2802/3102 include, but are not limited to, dielectric materials such as $SiO_2$, SiN and/or SiON.

Figure 28:
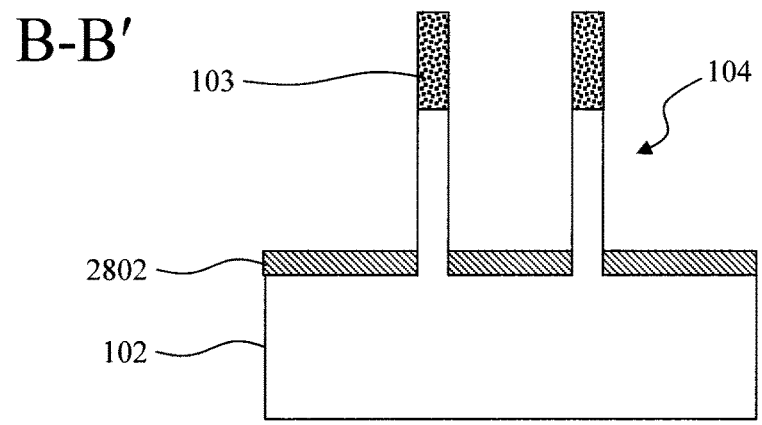
FIG. 28 is a fin width cross-section at ends of the fins illustrating a bottom protection layer having been formed on the substrate according to an embodiment of the present invention.
Figure 29:
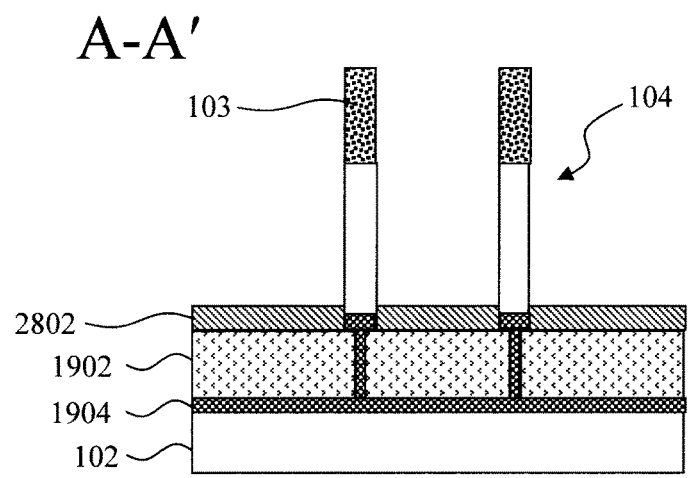
FIG. 29 is a fin width cross-section at a middle of the fins illustrating the bottom protection layer having been formed on the bottom source and drains according to an embodiment of the present invention.

Specifically, as shown in FIG. 28 (a fin width cross-section at the end of the fins 104) a bottom protection layer 2802 has been formed on the substrate 102. As noted above, due to the presence of the anchors 502 (which have now been removed) the bottom source and drain 1902 is absent at the ends of the fins 104. Thus, the bottom protection layer 2802 is deposited directly onto the substrate 102 in these regions at the ends of the fins 104. By contrast, as shown in FIG. 29 (a fin width cross-section at the middle of the fins 104) the bottom protection layer 2802 has been formed on the bottom source and drains 1902.

Figure 30:
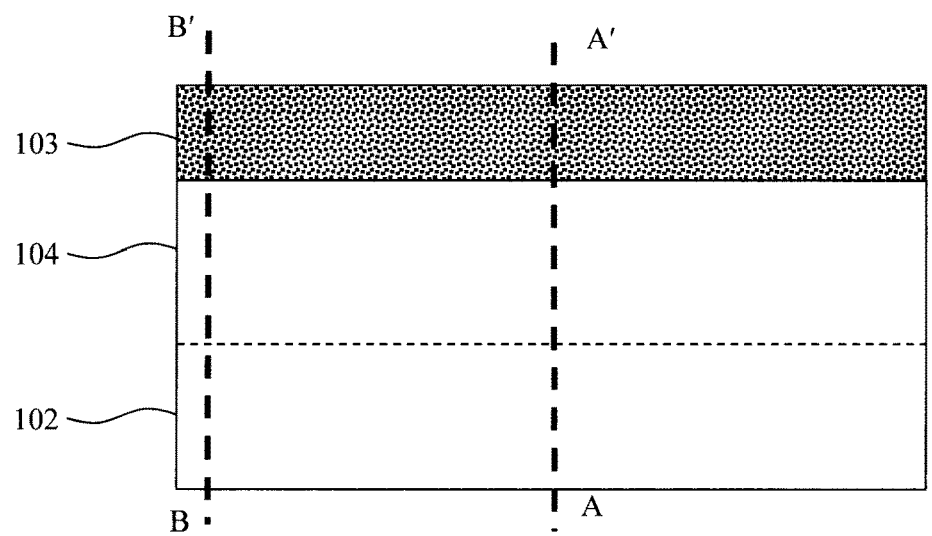
FIG. 30 is a fin length cross-section illustrating the fins after the bottom protection layer has been formed on the substrate and bottom source and drains according to an embodiment of the present invention.

Since the bottom protection layer 2802 is formed between the fins 104, the bottom protection layer 2802 is not visible in the fin length cross-section through one of the fins shown in FIG. 30. The cross-sectional view in FIG. 28 depicts a cut along the line B-B' in FIG. 30. The cross-sectional view in FIG. 29 depicts a cut along the line A-A' in FIG. 30.

Figure 31:
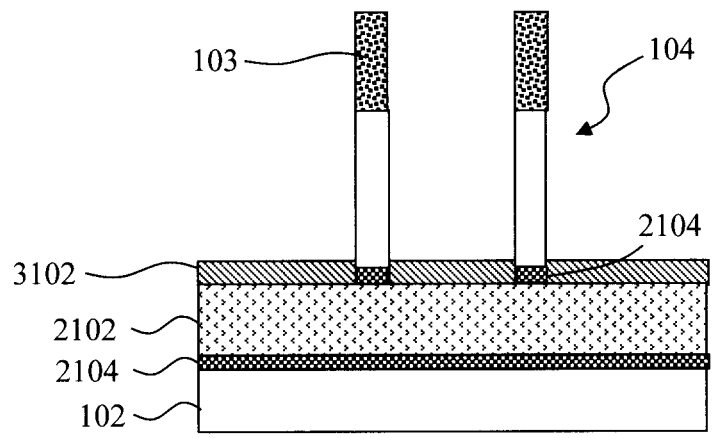
FIG. 31 is a fin width cross-section at a middle of the fins, according to the alternative embodiment where the fins are fully cut, illustrating the bottom protection layer having been formed on the bottom source and drains according to an embodiment of the present invention.
Figure 32:
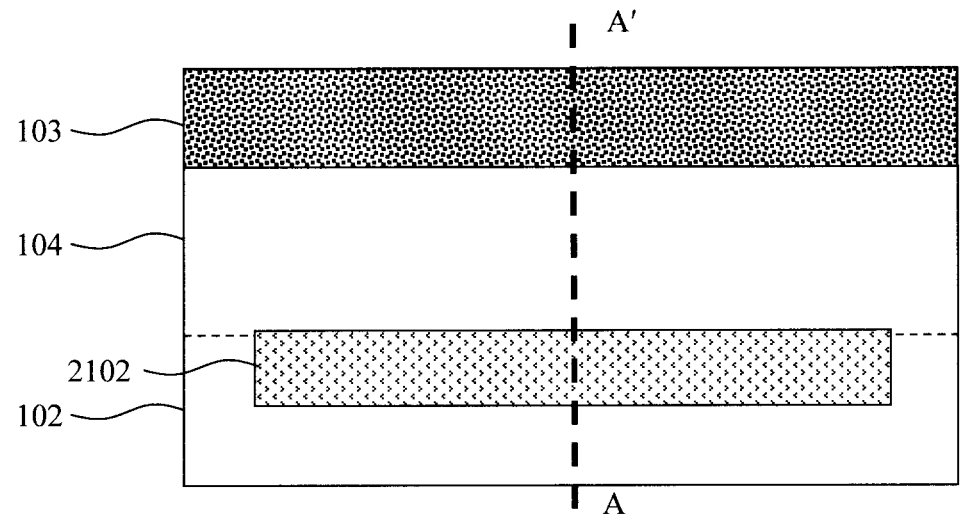
FIG. 32 is a fin length cross-section, according to the alternative embodiment where the fins are fully cut, illustrating the fins after the bottom protection layer has been formed on the substrate and bottom source and drains according to an embodiment of the present invention.

In the alternative embodiment where the fin bottoms are completely cut from the underlying substrate 102, as shown in FIG. 31 (a fin width cross-section at the middle of the fins 104) a bottom protection layer 3102 has been formed on the bottom source and drains 2102. As described above, since the bottom protection layer 3102 is formed between the fins 104, the bottom protection layer 3102 is not visible in the fin length cross-section through one of the fins shown in FIG. 32. The cross-sectional view in FIG. 32 depicts a cut along the line A-A' in FIG. 31.

An etch is then used to cut the fins 104 to a desired final length $l_{fin}$ of the vertical fin channels. See FIGS. 33-38. To do so, a patterned mask 3402/3702 is first formed on the middle portion of the fins 104 (i.e., the vertical fin channels). The mask 3402/3702 is then used to pattern the fins 104. According to an exemplary embodiment, the mask 3402/3702 is an organic planarizing (OPL) material such as an aromatic cross-linkable polymer (e.g., naphthalene-based). Other suitable organic planarizing materials are described, for example, in U.S. Pat. No. 7,037,994 issued to Sugita et al. entitled "Acenaphthylene Derivative, Polymer, and Anti-reflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process," the contents of each of which are incorporated by reference as if fully set forth herein. A directional etching process such as RIE can be used for the fin cut etch.

Figure 33:
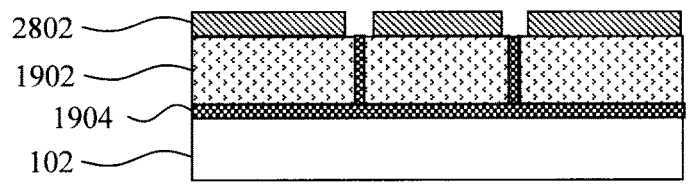
FIG. 33 is a fin width cross-section at ends of the fins illustrating the ends of the fins having been cut according to an embodiment of the present invention.
Figure 34:
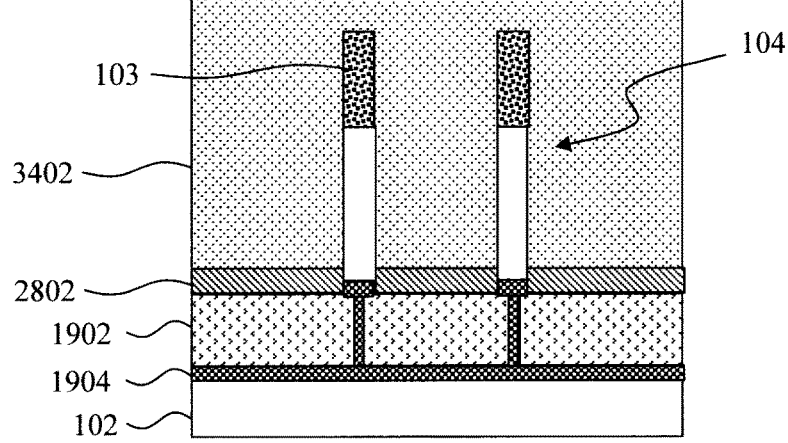
FIG. 34 is a fin width cross-section at a middle of the fins illustrating a mask having been formed to protect the middle of the fins during the fin cut according to an embodiment of the present invention.

As shown in FIG. 33 (a fin width cross-section through the cut fins 104), end portions of the fins 104 outside of the vertical fin channels have been removed. The fin width cross-section shown in FIG. 33 is through the fin cut region, but inward from where the anchors 502 were present. Thus, the bottom source and drains 1902 are present in FIG. 33. As shown in FIG. 34 (a fin width cross-section at the middle of the fins 104), the mask 3402 protects the middle portions of the fins 104 (i.e., the vertical fin channels) during the fin cut etch.

Figure 35:
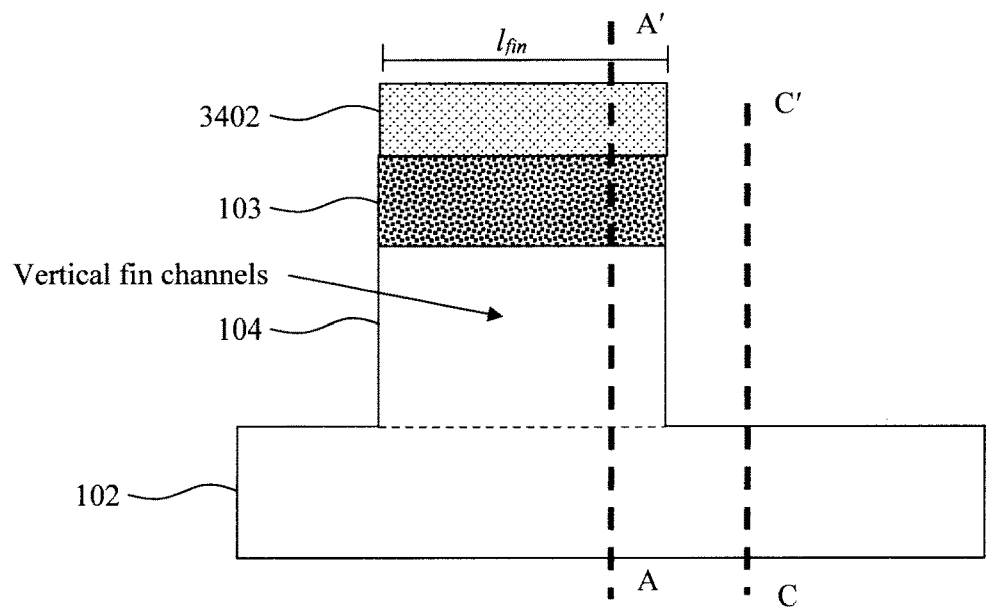
FIG. 35 is a fin length cross-section illustrating the ends of the fins having been cut according to an embodiment of the present invention.

As shown in FIG. 35 (a fin length cross-section through one of the fins 104) the mask 3402 defines the desired final length $l_{fin}$ of the vertical fin channels. The cross-sectional view in FIG. 33 depicts a cut along the line C-C' in FIG. 35. The cross-sectional view in FIG. 34 depicts a cut along the line A-A' in FIG. 35.

Figure 36:
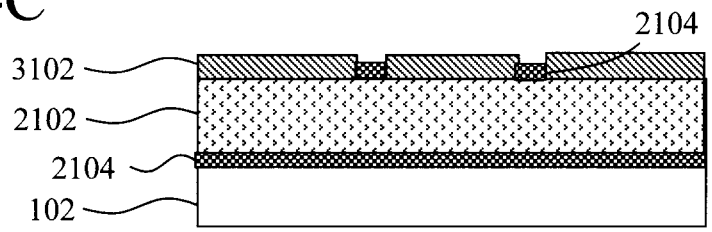
FIG. 36 is a fin width cross-section at ends of the fins, according to the alternative embodiment where the fins are fully cut, illustrating the ends of the fins having been cut according to an embodiment of the present invention.
Figure 37:
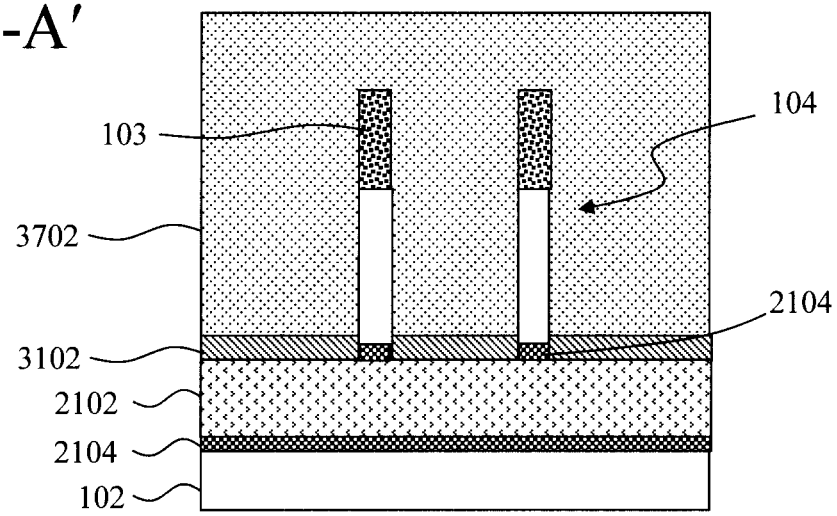
FIG. 37 is a fin width cross-section at a middle of the fins, according to the alternative embodiment where the fins are fully cut, illustrating a mask having been formed to protect the middle of the fins during the fin cut according to an embodiment of the present invention.

In the alternative embodiment where the fin bottoms are completely cut from the underlying substrate 102, as shown in FIG. 36 (a fin width cross-section through the cut fins 104), portions of the fins 104 outside of the vertical fin channels have been removed. The fin width cross-section shown in FIG. 36 is through the fin cut region, but inward from where the anchors 502 were present. Thus, the bottom source and drains 2102 are present in FIG. 36. As shown in FIG. 37 (a fin width cross-section at the middle of the fins 104), the mask 3702 protects the middle portions of the fins 104 (i.e., the vertical fin channels) during the fin cut etch.

Figure 38:
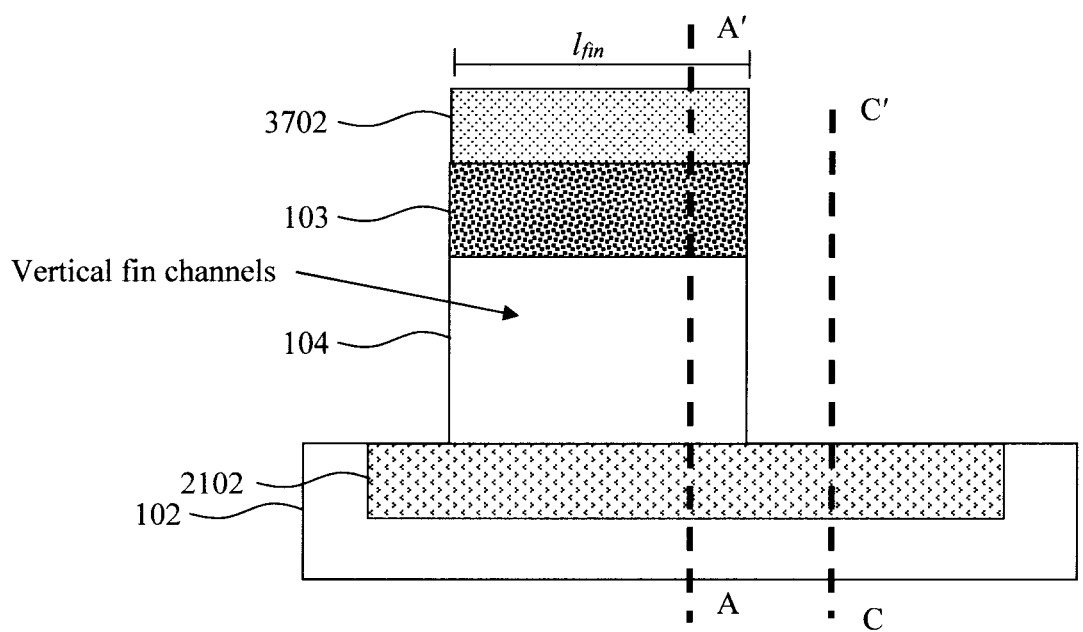
FIG. 38 is a fin length cross-section, according to the alternative embodiment where the fins are fully cut, illustrating the ends of the fins having been cut according to an embodiment of the present invention.

As shown in FIG. 38 (a fin length cross-section through one of the fins 104) the mask 3702 defines the desired final length $l_{fin}$ of the vertical fin channels. The cross-sectional view in FIG. 36 depicts a cut along the line C-C' in FIG. 38. The cross-sectional view in FIG. 37 depicts a cut along the line A-A' in FIG. 38.

Following the fin cut etch, the mask 3402/3702 and the bottom protection layer 2802/3102 are removed and shallow trench isolation (STI) regions 4002/4302 are formed to isolate the VFETs. See FIGS. 39-44. In general, STI involves patterning trenches in the substrate 102, and then filling the trenches with an insulator such as an oxide material (also referred to herein as an STI oxide).

Figure 39:
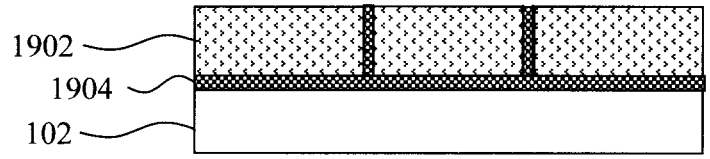
FIG. 39 is a fin width cross-section at ends of the fins illustrating the bottom protection layer having been removed according to an embodiment of the present invention.
Figure 40:
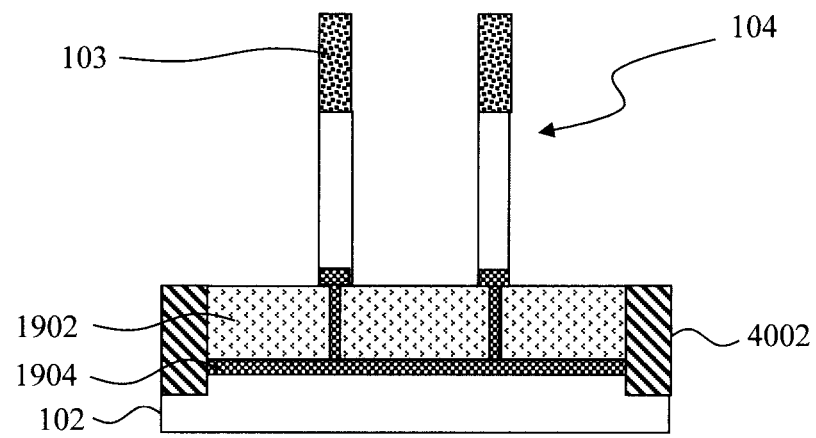
FIG. 40 is a fin width cross-section at a middle of the fins illustrating the mask and the bottom protection layer having been removed according to an embodiment of the present invention.

Specifically, as shown in FIG. 39 (a fin width cross-section through the cut fins 104) the bottom protection layer 2802 has been removed. Since the fin width cross-section shown in FIG. 39 is through the fin cut region, the mask 3402 was not present in this region. As shown in FIG. 40 (a fin width cross-section at the middle of the fins 104) both the mask 3402 and the bottom protection layer 2802 have been removed, and an STI region 4002 has been formed in the substrate 102 isolating the bottom source and drains 1902.

Figure 41:
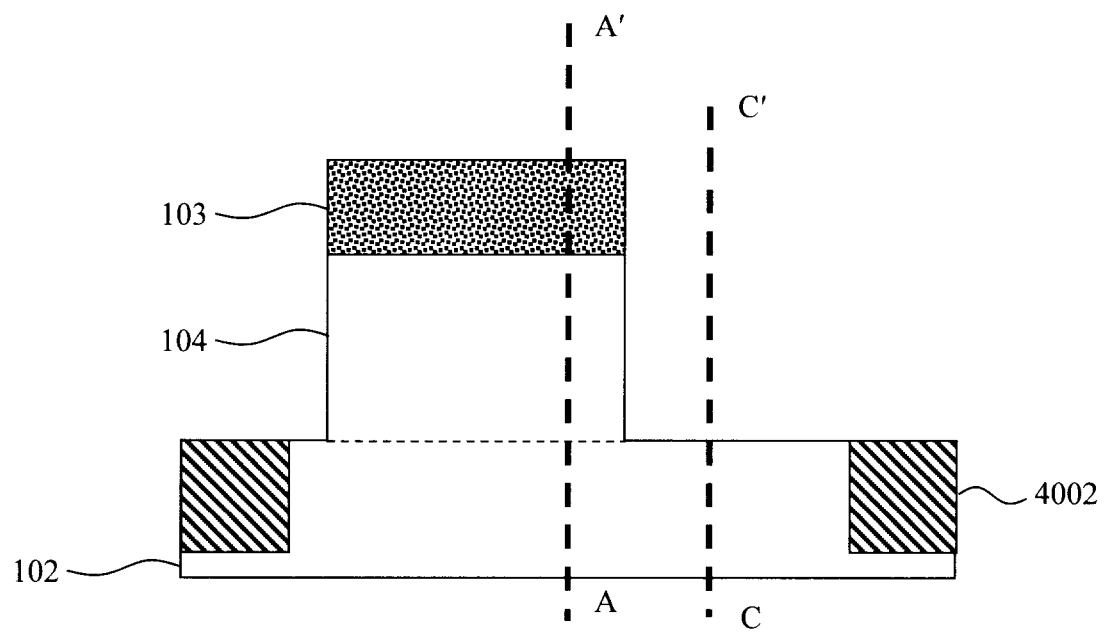
FIG. 41 is a fin length cross-section illustrating the mask and the bottom protection layer having been removed according to an embodiment of the present invention.

As shown in FIG. 41 (a fin length cross-section through one of the fins 104) the bottom protection layer 2802 has been removed. The cross-sectional view in FIG. 39 depicts a cut along the line C-C' in FIG. 41. The cross-sectional view in FIG. 40 depicts a cut along the line A-A' in FIG. 41.

Figure 42:
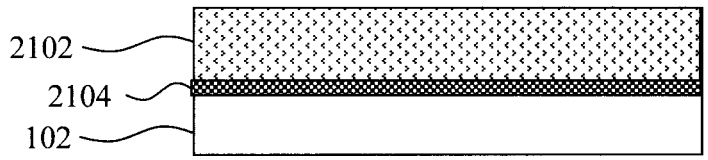
FIG. 42 is a fin width cross-section at ends of the fins, according to the alternative embodiment where the fins are fully cut, illustrating the bottom protection layer having been removed according to an embodiment of the present invention.
Figure 43:
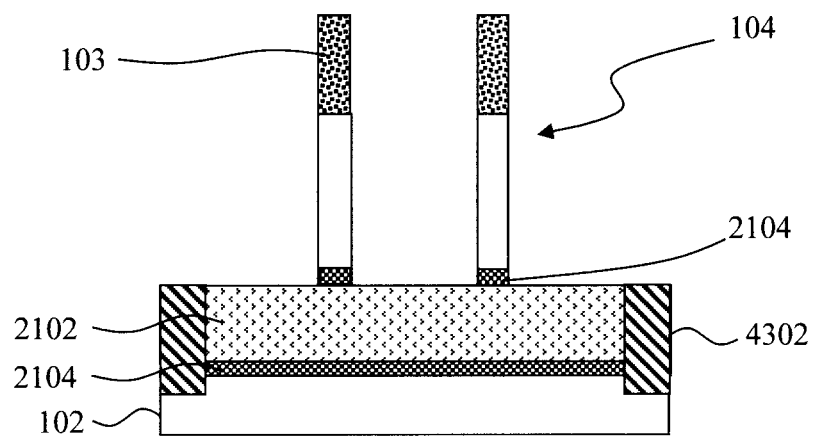
FIG. 43 is a fin width cross-section at a middle of the fins, according to the alternative embodiment where the fins are fully cut, illustrating the mask and the bottom protection layer having been removed according to an embodiment of the present invention.

In the alternative embodiment where the fin bottoms are completely cut from the underlying substrate 102, as shown in FIG. 42 (a fin width cross-section through the cut fins 104) the bottom protection layer 3102 has been removed. Since the fin width cross-section shown in FIG. 42 is through the fin cut region, the mask 3702 was not present in this region. As shown in FIG. 43 (a fin width cross-section at the middle of the fins 104) both the mask 3702 and the bottom protection layer 3102 have been removed, and an STI region 4302 has been formed in the substrate 102 isolating the bottom source and drains 2102.

Figure 44:
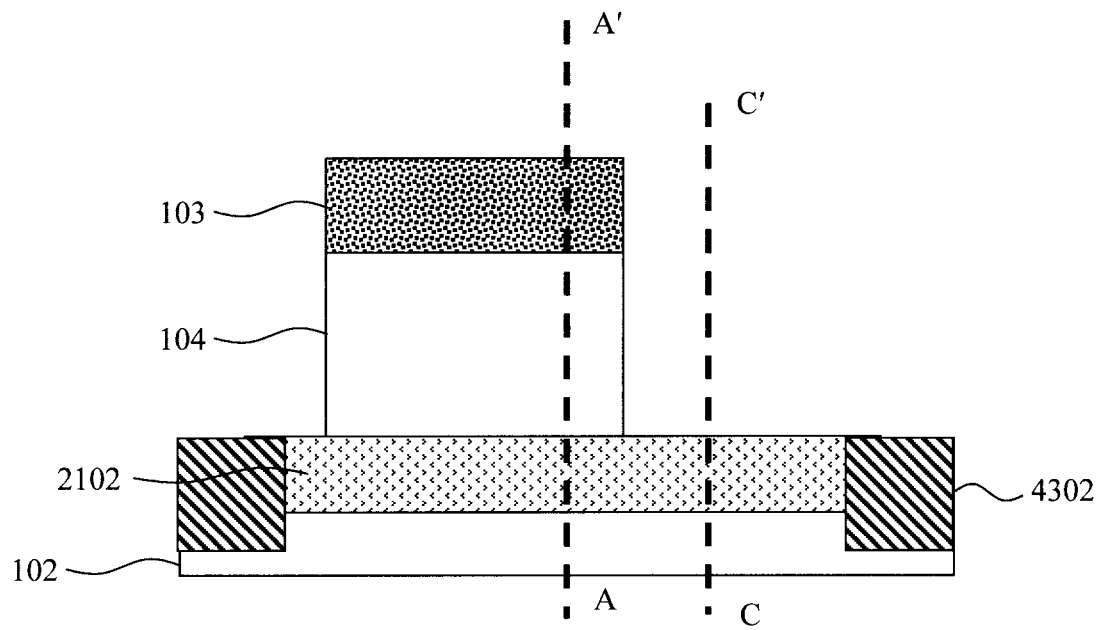
FIG. 44 is a fin length cross-section, according to the alternative embodiment where the fins are fully cut, illustrating the mask and the bottom protection layer having been removed according to an embodiment of the present invention.

As shown in FIG. 44 (a fin length cross-section through one of the fins 104) the bottom protection layer 3102 has been removed. The cross-sectional view in FIG. 42 depicts a cut along the line C-C' in FIG. 44. The cross-sectional view in FIG. 43 depicts a cut along the line A-A' in FIG. 44.

To complete the device, bottom spacers 4502/4702 are formed on the bottom source and drains 1902/2102, gates (i.e., a gate dielectric 4504/4704 and a gate conductor 4506/4706) are formed above the bottom spacers 4502/4702 alongside the vertical fin channels, top spacers 4510/4710 are formed above the gates, top source and drains 4512/4712 are formed above the top spacers and contacts are formed to the bottom and top source and drains. See FIGS. 45-48.

Figure 45:
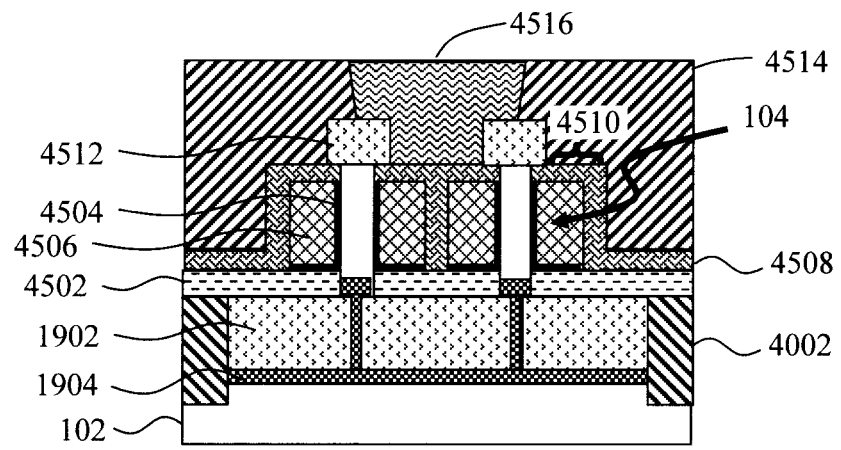
FIG. 45 is a fin width cross-section at a middle of the fins illustrating bottom spacers having been formed on the bottom source and drains, gates having been formed above the bottom spacers, top spacers having been formed above the gates, top source and drains having been formed above the top spacers, an interlayer dielectric (ILD) having been deposited over the device, and a top source and drain contact having been formed in the ILD according to an embodiment of the present invention.

Specifically, as shown in FIG. 45 (a fin width cross-section at the middle of the fins 104), bottom spacers 4502 are formed on the bottom source and drains 1902. Suitable materials for the bottom spacers 4502 include, but are not limited to, oxide spacer materials such as silicon dioxide ($SiO_2$) and/or silicon oxycarbide (SiOC) and/or nitride spacer materials such as SiN and/or silicon-boron-nitride (SiBN). According to an exemplary embodiment, the bottom spacers 4502 are formed using a directional deposition process (e.g., HDP CVD or PVD) whereby a greater amount of the spacer material is deposited onto horizontal surfaces (including the bottom source and drains 1902) than on vertical surfaces. Thus, when an etch is used on the spacer material, the timing of the etch needed to remove the spacer material from the vertical surfaces will leave the bottom spacers 4502 shown in FIG. 45 on the bottom source and drains 1902.

To form the gates, a conformal gate dielectric 4504 is deposited onto sidewalls of the fins 104 and onto bottom spacers 4502. A gate conductor 4506 is then deposited onto the conformal gate dielectric 4504.

According to an exemplary embodiment, a metal gate is formed wherein the gate conductor 4506 is a metal or combination of metals and the gate dielectric 4504 is a high-κ dielectric. For instance, the gate conductor 4506 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

An encapsulation layer 4508 is then formed over the fins 104 covering the gates. Suitable materials for the encapsulation layer 4508 include, but are not limited to, oxide materials such as $SiO_2$ and/or SiOC and/or nitride materials such as SiN and/or SiBN. As shown in FIG. 45, the formation of the encapsulation layer 4508 provides top spacers 4510 above the gates.

The fin hardmasks 103 are removed and top source and drains 4512 are then formed above the top spacers 4510 at the tops of the fins 104. According to an exemplary embodiment, the top source and drains 4512 are formed from an n-type or p-type doped epitaxial material grown at the tops of the fins 104. Suitable epitaxial materials include, but are not limited to in-situ doped (i.e., during growth) or ex-situ doped (e.g., using a process such as ion implantation) epitaxial Si, epitaxial Ge, and/or epitaxial SiGe. As provided above, suitable n-type dopants include phosphorus (P) and/or arsenic (As), and suitable p-type dopants include, but are not limited to, boron (B).

The device is then buried in an interlayer dielectric (ILD) 4514. A contact 4516 to the top source and drains 4512 is then formed in the ILD 4514. As shown in FIG. 45, the contact 4516 is common to the top source and drains 4512 at the tops of each of the fins 104.

Figure 46:
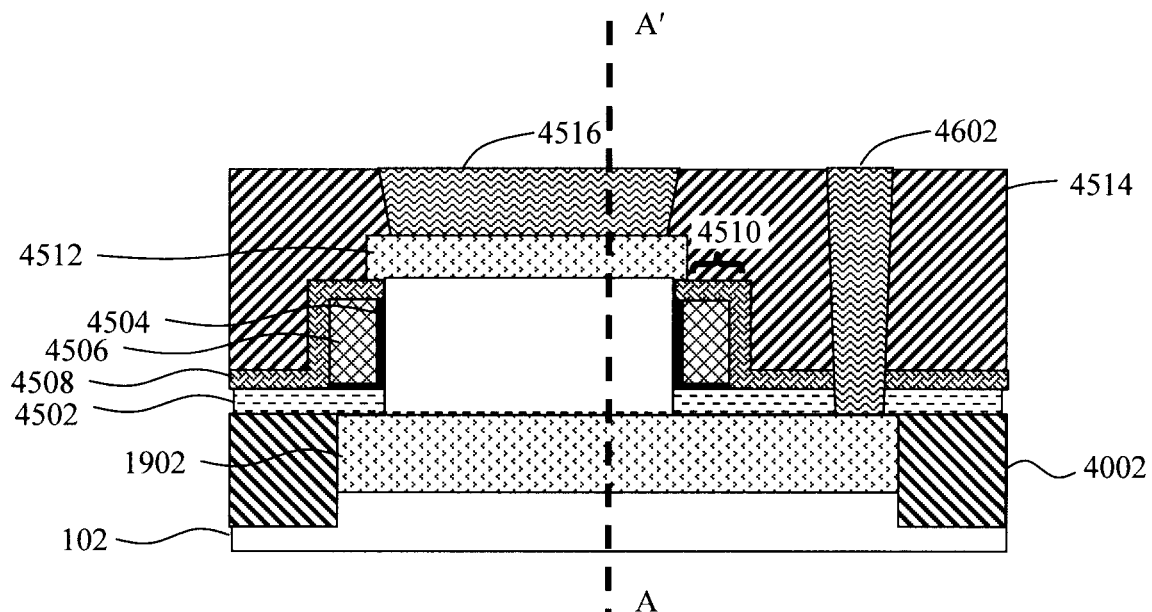
FIG. 46 is a fin length cross-section illustrating a bottom source and drain contact having been formed in the ILD according to an embodiment of the present invention.

As shown in FIG. 46 (a fin length cross-section through one of the fins 104) a contact 4602 has also been formed to the bottom source and drains 1902. The cross-sectional view in FIG. 45 depicts a cut along the line A-A' in FIG. 46.

Figure 47:
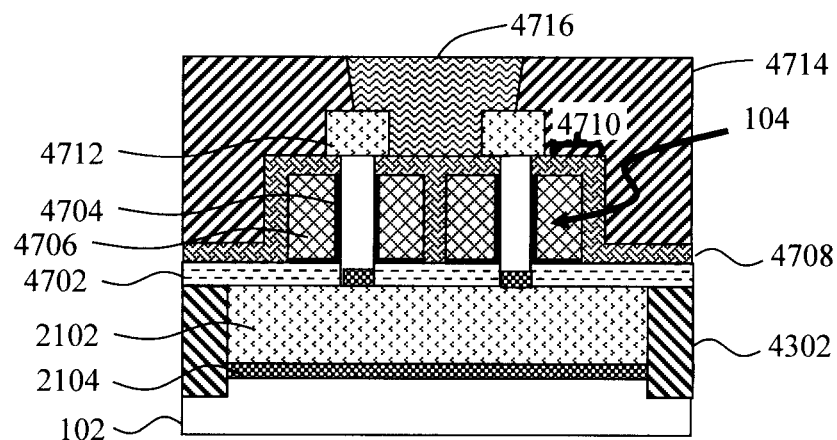
FIG. 47 is a fin width cross-section at a middle of the fins, according to the alternative embodiment where the fins are fully cut, illustrating bottom spacers having been formed on the bottom source and drains, gates having been formed above the bottom spacers, top spacers having been formed above the gates, top source and drains having been formed above the top spacers, an ILD having been deposited over the device, and a top source and drain contact having been formed in the ILD according to an embodiment of the present invention.

In the alternative embodiment where the fin bottoms are completely cut from the underlying substrate 102, as shown in FIG. 47 (a fin width cross-section at the middle of the fins 104), bottom spacers 4702 are formed on the bottom source and drains 2102. As provided above, suitable materials for the bottom spacers 4702 include, but are not limited to, oxide spacer materials such as $SiO_2$ and/or SiOC and/or nitride spacer materials such as SiN and/or SiBN. According to an exemplary embodiment, the bottom spacers 4702 are formed using a directional deposition process (e.g., HDP CVD or PVD) whereby a greater amount of the spacer material is deposited onto horizontal surfaces (including the bottom source and drains 2102) than on vertical surfaces. Thus, when an etch is used on the spacer material, the timing of the etch needed to remove the spacer material from the vertical surfaces will leave the bottom spacers 4702 shown in FIG. 47 on the bottom source and drains 2102.

To form the gates, a conformal gate dielectric 4704 is deposited onto sidewalls of the fins 104 and onto bottom spacers 4702. A gate conductor 4706 is then deposited onto the conformal gate dielectric 4704.

According to an exemplary embodiment, a metal gate is formed wherein the gate conductor 4706 is a metal or combination of metals and the gate dielectric 4704 is a high-κ dielectric. For instance, the gate conductor 4706 is a workfunction setting metal. Suitable high-κ dielectrics and workfunction setting metals were provided above.

An encapsulation layer 4708 is then formed over the fins 104 covering the gates. Suitable materials for the encapsulation layer 4708 include, but are not limited to, oxide materials such as $SiO_2$ and/or SiOC and/or nitride materials such as SiN and/or SiBN. As shown in FIG. 47, the formation of the encapsulation layer 4708 provides top spacers 4710 above the gates.

The fin hardmasks 103 are removed and top source and drains 4712 are then formed above the top spacers 4710 at the tops of the fins 104. According to an exemplary embodiment, the top source and drains 4712 are formed from an n-type or p-type doped epitaxial material grown at the tops of the fins 104. Suitable epitaxial materials include, but are not limited to in-situ doped (i.e., during growth) or ex-situ doped (e.g., using a process such as ion implantation) epitaxial Si, epitaxial Ge, and/or epitaxial SiGe. As provided above, suitable n-type dopants include phosphorus (P) and/or arsenic (As), and suitable p-type dopants include, but are not limited to, boron (B).

The device is then buried in an interlayer dielectric (ILD) 4714. A contact 4716 to the top source and drains 4712 is then formed in the ILD 4714. As shown in FIG. 47, the contact 4716 is common to the top source and drains 4712 at the tops of each of the fins 104.

Figure 48:
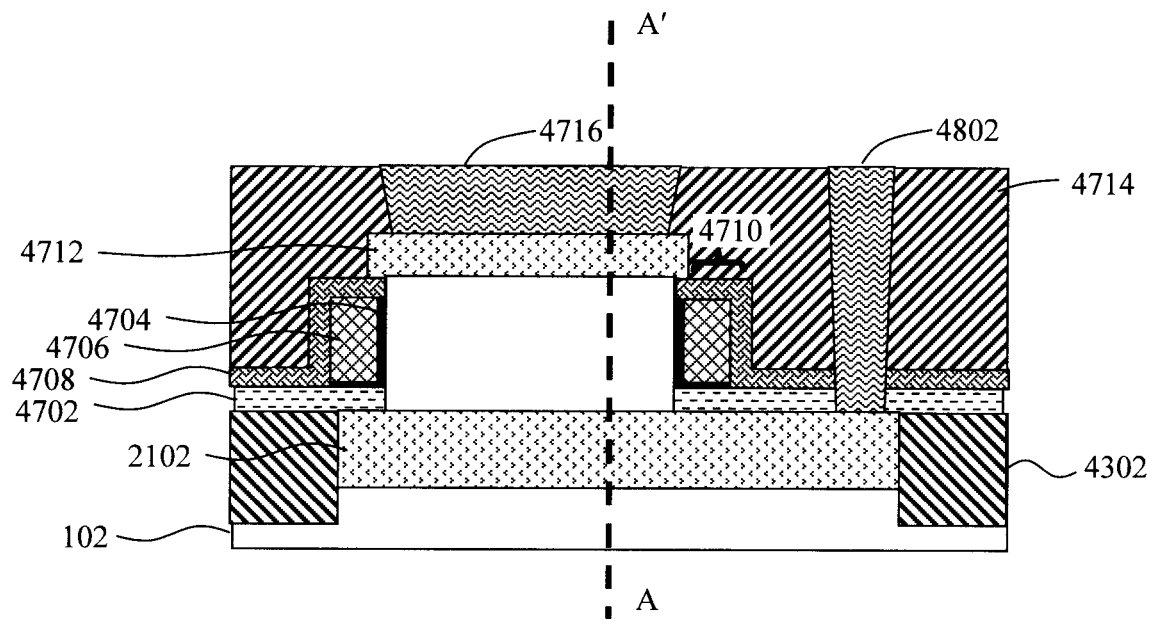
FIG. 48 is a fin length cross-section, according to the alternative embodiment where the fins are fully cut, illustrating a bottom source and drain contact having been formed in the ILD according to an embodiment of the present invention.

As shown in FIG. 48 (a fin length cross-section through one of the fins 104) a contact 4802 has also been formed to the bottom source and drains 2102. The cross-sectional view in FIG. 47 depicts a cut along the line A-A' in FIG. 48.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field-effect transistor (VFET) device, comprising:

at least one fin patterned in a substrate, wherein a top of the at least one fin has a width w, and a base of the at least one fin has a width w', and wherein w'<w;

bottom source and drains at the base of the at least one fin, wherein the base of the at least one fin only has the width w' below a top surface of the bottom source and drains;

bottom spacers on the bottom source and drains;

gates above the bottom spacers alongside the at least one fin;

top spacers above the gates; and top source and drains above the top spacers at the top of the at least one fin.

2. The VFET device of claim 1, wherein w is from about 5 nm to about 10 nm, and ranges therebetween, and wherein w' is from about 0 nm to about 8 nm, and ranges therebetween.

3. The VFET device of claim 1, wherein the gates comprise:
a conformal gate dielectric disposed onto sidewalls of the at least one fin and on the bottom source and drains; and
a gate conductor disposed on the conformal gate dielectric.

4. The VFET device of claim 3, wherein the conformal gate dielectric comprises a high-κ gate dielectric selected from the group consisting of: hafnium oxide ($HfO_2$), lanthanum oxide ($La_2O_3$), and combinations thereof.

5. The VFET device of claim 3, wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

6. The VFET device of claim 1, wherein the bottom source and drains, and the top source and drains each comprises an epitaxial material selected from the group consisting of: epitaxial silicon (Si), epitaxial germanium (Ge), epitaxial silicon germanium (SiGe) and combinations thereof.

7. The VFET device of claim 6, wherein the epitaxial material is doped with an n-type or a p-type dopant.

8. The VFET device of claim 1, wherein the bottom spacers and the top spacers each comprise a material selected from the group consisting of: silicon dioxide ($SiO_2$), silicon oxycarbide (SiOC), silicon nitride (SiN), silicon-boron-nitride (SiBN), and combinations thereof.

9. The VFET device of claim 1, further comprising:
an interlayer dielectric (ILD) surrounding the VFET device.

10. The VFET device of claim 9, further comprising:
a first contact to the top source and drains formed in the ILD; and
a second contact to the bottom source and drains formed in the ILD.

11. The VFET device of claim 10, wherein the VFET device comprises multiple fins, and wherein the first contact is common to the top source and drains at the tops of each of the multiple fins.

12. A vertical field-effect transistor (VFET) device, comprising:
at least one fin patterned in a substrate;
bottom source and drains below the at least one fin, wherein the at least one fin is completely separated from the substrate over the bottom source and drains such that the at least one fin rests fully on the bottom source and drains;
bottom spacers on the bottom source and drains;
bottom source and drain extensions present in a base of the at least one fin below a top surface of the bottom spacers;
gates above the bottom spacers alongside the at least one fin;
top spacers above the gates; and
top source and drains above the top spacers at a top of the at least one fin.

13. The VFET device of claim 12, wherein the gates comprise:
a conformal gate dielectric disposed onto sidewalls of the at least one fin and on the bottom source and drains; and
a gate conductor disposed on the conformal gate dielectric.

14. The VFET device of claim 13, wherein the conformal gate dielectric comprises a high-κ gate dielectric selected from the group consisting of: $HfO_2$, $La_2O_3$, and combinations thereof.

15. The VFET device of claim 13, wherein the gate conductor comprises a workfunction setting metal selected from the group consisting of: TiN, TaN, Al-containing alloys, TiAl, TiAlN, TiAlC, TaAl, TaAlN, TaAlC, W, and combinations thereof.

16. The VFET device of claim 12, wherein the bottom source and drains, and the top source and drains each comprises an epitaxial material selected from the group consisting of: epitaxial Si, epitaxial Ge, epitaxial SiGe and combinations thereof.

17. The VFET device of claim 16, wherein the epitaxial material is doped with an n-type or a p-type dopant.

18. The VFET device of claim 12, wherein the bottom spacers and the top spacers each comprise a material selected from the group consisting of: $SiO_2$, SiOC, SiN, SiBN, and combinations thereof.

19. The VFET device of claim 12, further comprising:
an interlayer dielectric (ILD) surrounding the VFET device;
a first contact to the top source and drains formed in the ILD; and
a second contact to the bottom source and drains formed in the ILD.

20. The VFET device of claim 19, wherein the VFET device comprises multiple fins, and wherein the first contact is common to the top source and drains at the tops of each of the multiple fins.

* * * * *